US011474942B2

(12) United States Patent
Balakrishnan et al.

(10) Patent No.: US 11,474,942 B2
(45) Date of Patent: Oct. 18, 2022

(54) SUPPORTING RESPONSES FOR MEMORY TYPES WITH NON-UNIFORM LATENCIES ON SAME CHANNEL

(71) Applicant: Advanced Micro Devices, Inc., Santa Clara, CA (US)

(72) Inventors: Kedarnath Balakrishnan, Bangalore (IN); James Raymond Magro, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 142 days.

(21) Appl. No.: 16/959,496

(22) PCT Filed: Sep. 20, 2018

(86) PCT No.: PCT/US2018/051925
§ 371 (c)(1),
(2) Date: Jul. 1, 2020

(87) PCT Pub. No.: WO2019/133086
PCT Pub. Date: Jul. 4, 2019

(65) Prior Publication Data
US 2021/0056027 A1    Feb. 25, 2021

Related U.S. Application Data

(63) Continuation of application No. 15/856,430, filed on Dec. 28, 2017, now Pat. No. 10,275,352.

(51) Int. Cl.
*G11C 7/00* (2006.01)
*G06F 12/0811* (2016.01)
(Continued)

(52) U.S. Cl.
CPC ........ *G06F 12/0811* (2013.01); *G06F 12/084* (2013.01); *G06F 12/0875* (2013.01);
(Continued)

(58) Field of Classification Search
CPC ............... G06F 12/0811; G06F 12/084; G06F 12/0875; G06F 12/0897; G06F 13/1626;
(Continued)

(56) References Cited

U.S. PATENT DOCUMENTS 6,212,611 B1    4/2001   Nizar et al.
8,321,627 B1   11/2012   Norrie et al.
(Continued)

OTHER PUBLICATIONS

International Search Report and Written Opinion in International Application No. PCT/US2018/051925, dated Jan. 22, 2019, 11 pages.
(Continued)

*Primary Examiner* — Tha-O H Bui
(74) *Attorney, Agent, or Firm* — Rory D. Rankin; Kowert, Hood, Munyon, Rankin & Goetzel, P.C.

(57) ABSTRACT

Systems, apparatuses, and methods for identifying response data arriving out-of-order from two different memory types are disclosed. A computing system includes one or more clients for processing applications. A memory channel transfers memory traffic between a memory controller and a memory bus connected to each of a first memory and a second memory different from the first memory. The memory controller determines a given point in time when read data is to be scheduled to arrive on the memory bus from memory. The memory controller associates a unique identifier with the given point in time. The memory controller identifies a given command associated with the arriving read data based on the given point in time.

20 Claims, 14 Drawing Sheets

(51) Int. Cl.
*G06F 12/084* (2016.01)
*G06F 12/0875* (2016.01)
*G11C 16/34* (2006.01)
*G06F 15/78* (2006.01)
*G11C 16/04* (2006.01)
*G11C 16/10* (2006.01)
*G06F 12/0897* (2016.01)
*G06F 13/16* (2006.01)

(52) U.S. Cl.
CPC ...... *G06F 12/0897* (2013.01); *G06F 13/1626* (2013.01); *G06F 13/1657* (2013.01); *G06F 13/1694* (2013.01); *G06F 15/7821* (2013.01); *G11C 16/0408* (2013.01); *G11C 16/10* (2013.01); *G11C 16/3459* (2013.01)

(58) Field of Classification Search
CPC ............. G06F 13/1657; G06F 13/1694; G06F 15/7821; G11C 16/0408; G11C 16/10; G11C 16/3459
USPC ......................................................... 365/203
See application file for complete search history.

(56) References Cited

U.S. PATENT DOCUMENTS

| | | |
|---|---|---|
| 8,775,745 B2 * | 7/2014 | Lee ..................... G06F 12/1425 710/36 |
| 9,772,059 B2 | 9/2017 | Mathey |
| 9,805,179 B2 | 10/2017 | Mcewen et al. |
| 10,049,196 B2 | 8/2018 | Mcewen et al. |
| 10,068,636 B2 | 9/2018 | Akin et al. |
| 10,133,490 B2 | 11/2018 | Sinclair et al. |
| 10,275,352 B1 | 4/2019 | Balakrishnan et al. |
| 2011/0258353 A1 | 10/2011 | Wang |
| 2012/0290810 A1 | 11/2012 | Lecler et al. |
| 2015/0095605 A1 | 4/2015 | Roberts et al. |
| 2016/0371014 A1 * | 12/2016 | Roberts ................. G06F 3/0688 |
| 2018/0239547 A1 | 8/2018 | Inbar et al. |

OTHER PUBLICATIONS

First Examination Report in Indian Patent Application No. 202017031369, dated Mar. 23, 2022, 8 pages.

* cited by examiner

SUPPORTING RESPONSES FOR MEMORY TYPES WITH NON-UNIFORM LATENCIES ON SAME CHANNEL

"This application is a U.S. National Stage Entry of International Patent Application No. PCT/US2018/051925, entitled "SUPPORTING RESPONSES FOR MEMORY TYPES WITH NON-UNIFORM LATENCIES ON SAME CHANNEL", filed on Sep. 20, 2018, which claims the benefit of U.S. patent application Ser. No. 15/856,430, entitled "SUPPORTING RESPONSES FOR MEMORY TYPES WITH NON-UNIFORM LATENCIES ON SAME CHANNEL", filed Dec. 28, 2017, the entirety of which is incorporated herein by reference."

BACKGROUND

Description of the Related Art

A variety of computing devices utilize heterogeneous integration, which integrates multiple types of ICs for providing system functionality. The multiple functions are placed in a processing node and the multiple functions include audio/video (A/V) data processing, other high data parallel applications for the medicine and business fields, processing instructions of a general-purpose instruction set architecture (ISA), digital, analog, mixed-signal and radio-frequency (RF) functions, and so forth. A variety of choices exist for placing a processing node in system packaging to integrate the multiple types of ICs. Some examples are a system-on-a-chip (SOC), multi-chip modules (MCMs) and a system-in-package (SiP).

Regardless of the choice for system packaging, in several uses, the performance of one or more computing systems can depend on the processing node. In one example, the processing node is one of multiple processing nodes in a socket of a multi-socket server. The server is used to provide services to other computer programs in remote computing devices as well as computer programs within the server. In another example, the processing node is used within a mobile computing device running several different types of applications and possibly relaying information to multiple users (both local and remote) at one time.

Maintaining performance at relatively high levels typically requires quick access to stored data. Several types of data-intensive applications rely on quick access to data storage to provide reliable high-performance for several local and remote programs and their users. The memory hierarchy transitions from relatively fast, volatile memory, such as registers on a processor die and caches either located on the processor die or connected to the processor die, to non-volatile and relatively slow memory. The interfaces and access mechanisms for the different types of memory also changes. Therefore, any hybrid proposals for combining two different types of memory in the hierarchy provides challenges to maintain high performance for quick access demands by the running computer programs.

In view of the above, efficient methods and systems for identifying response data arriving out-of-order from two different memory types are desired.

BRIEF DESCRIPTION OF THE DRAWINGS

The advantages of the methods and mechanisms described herein may be better understood by referring to the following description in conjunction with the accompanying drawings, in which.

Figure 1:
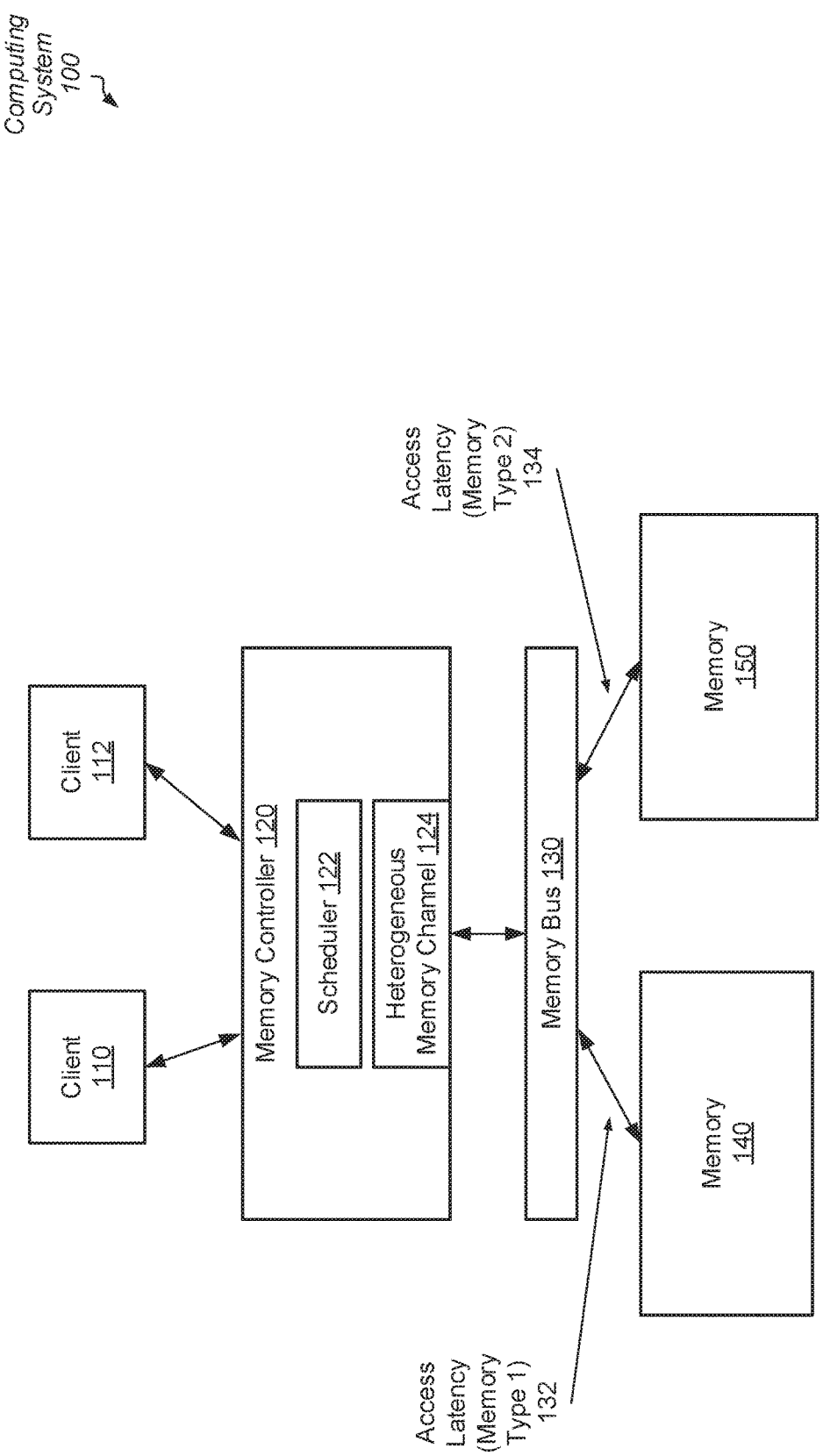
FIG. 1 is a block diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for identifying response data arriving out-of-order from two different memory types are disclosed. In various embodiments, a computing system includes one or more clients for processing applications. Examples of the clients are a general-purpose central processing unit (CPU), a graphics processing unit (GPU), an accelerated processing unit (APU), an input/output (I/O) device and so forth. A memory channel within a memory controller transfers memory traffic between the memory controller and a memory bus connected to each of a first memory and a second memory.

In various embodiments, the first memory and the second memory utilize different data storage technologies and have different access latencies. The access latencies of the first memory and the second memory can differ between them by at least a threshold amount of time. In other embodiments, each of the first memory and the second memory use a same data storage technology, but still have access latencies that differ by at least the threshold amount of time. For example, in an embodiment, the first memory uses a same data storage technology as the second memory, but the first memory uses an onboard cache, whereas the second memory does not.

Each of the first memory and the second memory can include one of a variety of random access memory (RAM), such as a variety of dynamic random access memory (DRAM), one of a variety of non-volatile (NV) dual in-line memory modules (DIMMs) such as NVDIMM-P, one of another type of data storage technologies such as phase-change memories (PCM), ferroelectric memories (FeRAM), magnetoresistive memories (MRAM), resistive memories (ReRAM or RRAM), three dimensional (3D) cross-point (XPoint) memories, and so forth. Accordingly, the differences between the one or more access latencies of the first memory and the one or more access latencies of the second memory can exceed a threshold. In some embodiments, the access latencies for the first memory measured from an issue of a read command to a received response with valid data are on a scale of 10's of nanoseconds. In various embodiments, the access latencies for the second memory measured from an issue of a read or status command to a received response is on a scale of 100's of nanoseconds. Therefore, the differences between latencies exceed 100's of nanoseconds, which can be above a given threshold amount of time.

In various embodiments, a command processor or other logic translates each received memory request to one or more commands. A scheduler in the memory controller determines whether there are two pending memory access commands such as a first command for the first memory type and a second command for the second memory type. The scheduler determines whether each of the first command and the second command can be issued without causing a data collision on the shared memory data bus. For example, based on the point in time for issuing a selected command in addition to the access latencies of each of the first memory and the second memory, the memory controller keeps track of points in time when read response data is scheduled to arrive on the shared memory data bus. In some embodiments, points in time are measured by clock cycles. If selecting either of the first command and the second command would not schedule a data collision on the shared memory data bus, then each of the first command and the second command remains a candidate for issue. In such a case, the scheduler selects a command from the first command and the second command based on arbitration logic.

In other embodiments, to avoid data collisions on the shared memory data bus, the scheduler in the memory controller determines a next given point in time that does not already have read response data scheduled to be on memory data bus. The scheduler then determines whether there is time to schedule a first memory access command for accessing the first memory that will provide response data at the given point in time. The scheduler also determines whether there is time to schedule a second memory access command for accessing the second memory that will provide response data at the given point in time.

If there is sufficient time for at least one of the first access command and the second access command to provide response data at the given point in time, then the scheduler selects one of the first memory access command and the second memory access command based on arbitration logic. In an embodiment, the arbitration logic uses weighted criteria. The criteria includes at least priority levels, ages, and so forth. Afterward, the scheduler issues the selected access command to one of the first memory and the second memory via the memory channel.

In some embodiments, when the scheduler schedules a given command to issue, the scheduler determines a given point in time for requested read data to be scheduled to arrive on the shared memory data bus. In an embodiment, the scheduler adds the latency of the given command to a point in time the scheduler schedules to issue the given command. In some embodiments, the scheduler generates an identifier as an indication of the entry in a request queue storing information corresponding to the given command. In other embodiments, the scheduler generates an identifier based on a combination of one or more of a thread identifier and a portion of a target address of the memory request corresponding to the given command. The scheduler stores an association of the identifier with the given point in time. In an embodiment, a table is used. Therefore, the scheduler is able to identify the given command with arriving requested read data on the shared memory data bus based on the given point in time, rather than based on a tag inserted in the given command or with a packet associated with the arriving requested read data.

Referring to FIG. 1, a generalized block diagram of one embodiment of a computing system 100 is shown. As shown, clients 110 and 112 send memory requests to memory controller 120. A memory channel 124 within memory controller 120 transfers memory traffic between memory controller 120 and memory bus 130. Each of memory 140 and memory 150 store data accessed by clients 110 and 112. In various embodiments, one or more of memory 140 and memory 150 is used as system memory by clients 110 and 112. In various embodiments, the access latency of memory 140 differs from the access latency of memory 150 by at least a threshold amount of time. In some embodiments, memory 140 and memory 150 use different data storage technology, and accordingly, the access latencies of memory 140 and memory 150 differ between them by at least the threshold amount of time. In other embodiments, each of memory 140 and memory 150 use a same data storage technology, but still have access latencies that differ by at least the threshold amount of time. For example, in an embodiment, memory 140 uses a same data storage technology as memory 150, but memory 140 uses an onboard cache, whereas memory 150 does not. Accordingly, the access latencies are different between memory 140 and memory 150 and can differ by the threshold amount of time. In other embodiments, other configurations and/or other components can be used by one of memory 140 and memory 150 but not in the other, which causes the different access latencies between them.

A communication fabric, an input/output (I/O) interface for I/O devices and any links and interfaces for network connections are not shown in computing system 100 for ease of illustration. In some embodiments, the components of computing system 100 are individual dies on an integrated circuit (IC), such as a system-on-a-chip (SOC). In other embodiments, the components are individual dies in a system-in-package (SiP) or a multi-chip module (MCM). In some embodiments, clients 110 and 112 include one or more of a central processing unit (CPU), a graphics processing unit (GPU), a hub for a multimedia engine, and so forth. Each of clients 110 and 112 is one of a variety of computing resources capable of processing applications and generating memory requests.

Although a single memory controller 120 is shown, in other embodiments, another number of memory controllers are used in computing system 100. In various embodiments, memory controller 120 receives memory requests from clients 110 and 112, and scheduler 122 schedules the memory requests and sends the scheduled memory requests to one of memory 140 and 150 via memory channel 124. In some embodiments, scheduler 122 within memory controller 120 includes control logic, which schedules memory requests targeting memory locations in memory 140 separately from scheduling memory requests targeting memory locations in memory 150. Afterward, scheduler 122 selects between memory requests targeting memory 140 and memory requests targeting memory 150. In an embodiment, scheduler 122 mixes accesses targeting memory 140 and memory 150.

The control logic in scheduler 122 for scheduling memory requests uses information such as quality-of-service (QoS) or other priority levels of the memory requests, process or software thread identifiers (IDs) of the memory requests, ages of the memory requests, an amount of time since a memory request had been issued to memory 140, an amount of time since a memory request had been issued to memory 150, and so forth. Therefore, scheduler 122 supports out-of-order issue of memory requests. When scheduler 122 selects a memory request to send to one of memory 140 and memory 150, scheduler 122 sends the selected memory request to memory channel 124 for transfer.

Memory channel 124 interfaces with each of memory 140 and memory 150. Memory channel 124 supports a protocol used for interfacing with memory 140 and supports another protocol used for interfacing with memory 150. The protocols determine values used for information transfer, such as a number of data transfers per clock cycle, signal voltage levels, signal timings, signal and clock phases and clock frequencies.

In various embodiments, memory bus 130 supports sending data traffic in a single direction for a given amount of time, such as during a given mode of the read mode and the write mode, and then sends data traffic in the opposite direction for another given amount of time such as during the other mode of the read mode and the write mode. In an embodiment, memory bus 130 utilizes a single command bus and a single data bus. Therefore, scheduling the issue of memory requests to memory 140 and memory 150 is performed in a manner to avoid data collisions on memory bus 130.

As described earlier, in some embodiments, memory 140 and memory 150 use different data storage technology, and accordingly, have different access latencies. As shown, memory 140 has access latency 132, which differs from access latency 134 of memory 150 by at least a threshold amount of time. Although a single access latency is shown for each of memory 140 and memory 150, in other embodiments, one or more of memory 140 and memory 150 has multiple access latencies. However, each of the multiple access latencies for memory 140 differs from each one of the multiple access latencies of memory 150 by at least a threshold amount of time.

In one embodiment, one of memory 140 and memory 150 includes one of a variety of dynamic random access memory (DRAM) while the other one of memory 140 and memory 150 includes one of a variety of non-volatile (NV) dual in-line memory modules (DIMMs) such as NVDIMM-P. In other embodiments, other memory types with different access latencies are used for memory 140 and memory 150. For example, besides using types of random access memory (RAM) technologies and NVDIMM technologies, in some embodiments, each of memory 140 and memory 150 include other examples of data storage technologies such as phase-change memories (PCM), ferroelectric memories (FeRAM), magnetoresistive memories (MRAM), resistive memories (ReRAM or RRAM), three dimensional (3D) cross-point (XPoint) memories, and so forth. In various embodiments, the differences between access latencies of memory 140 and access latencies of memory 150 are above a threshold. Accordingly, scheduler 122 includes control logic and sequential elements for issuing memory access commands targeting locations in memory 140 and memory 150 in a mixed manner.

In some embodiments, memory controller 120 includes a command processor for translating each received memory request to one or more commands. In one embodiment, scheduler 122 determines whether there are two pending memory access commands such as a first command for memory 140 and a second command for memory 150. Scheduler 122 determines whether each of the first command and the second command can be issued without causing a data collision on the shared memory data bus 130. For example, based on the point in time for issuing a selected command, the access latency 132 and the access latency 134, memory controller 120 keeps track of points in time when data is scheduled to arrive on the shared memory data bus 130. The pending first command and second command can be read accesses or write accesses. In some embodiments, points in time are measured by clock cycles. If selecting either of the first command and the second command would not schedule a data collision on the shared memory data bus 130, then each of the first command and the second command remains a candidate for issue. In such a case, scheduler 122 selects a command from the first command and the second command based on arbitration logic. In an embodiment, the arbitration logic uses weighted criteria.

In other embodiments, to avoid data collisions on memory bus 130 despite an appreciable difference between access latency 132 and access latency 134, scheduler 122 determines a next given point in time that the memory bus 130 is scheduled to be available. In other words, scheduler 122 determines a next given point in time that does not already have read response data or write data scheduled to be driven on memory bus 130. In some embodiments, points in time are measured by clock cycles. Scheduler 122 also determines whether there is time to schedule the first command for accessing memory 140 and the second command for accessing memory 150 to provide data at the given point in time. As described earlier, the command processor translates received memory requests to commands. In an embodiment, one or more of the first command and the second command have one or more preceding commands and/or one or more subsequent commands, which add latency and delay when the first command and the second command can issue.

If there is sufficient time for at least one of the first access command and the second access command to provide data at the given point in time when memory bus 130 is available, scheduler 122 selects one of the first memory access command and the second memory access command. The criteria described earlier, such as priority levels, ages, and so forth, can be used by scheduler 122. Afterward, scheduler 122 sends the selected access command to one of memory 140 and memory 150 via memory channel 124.

Figure 2:
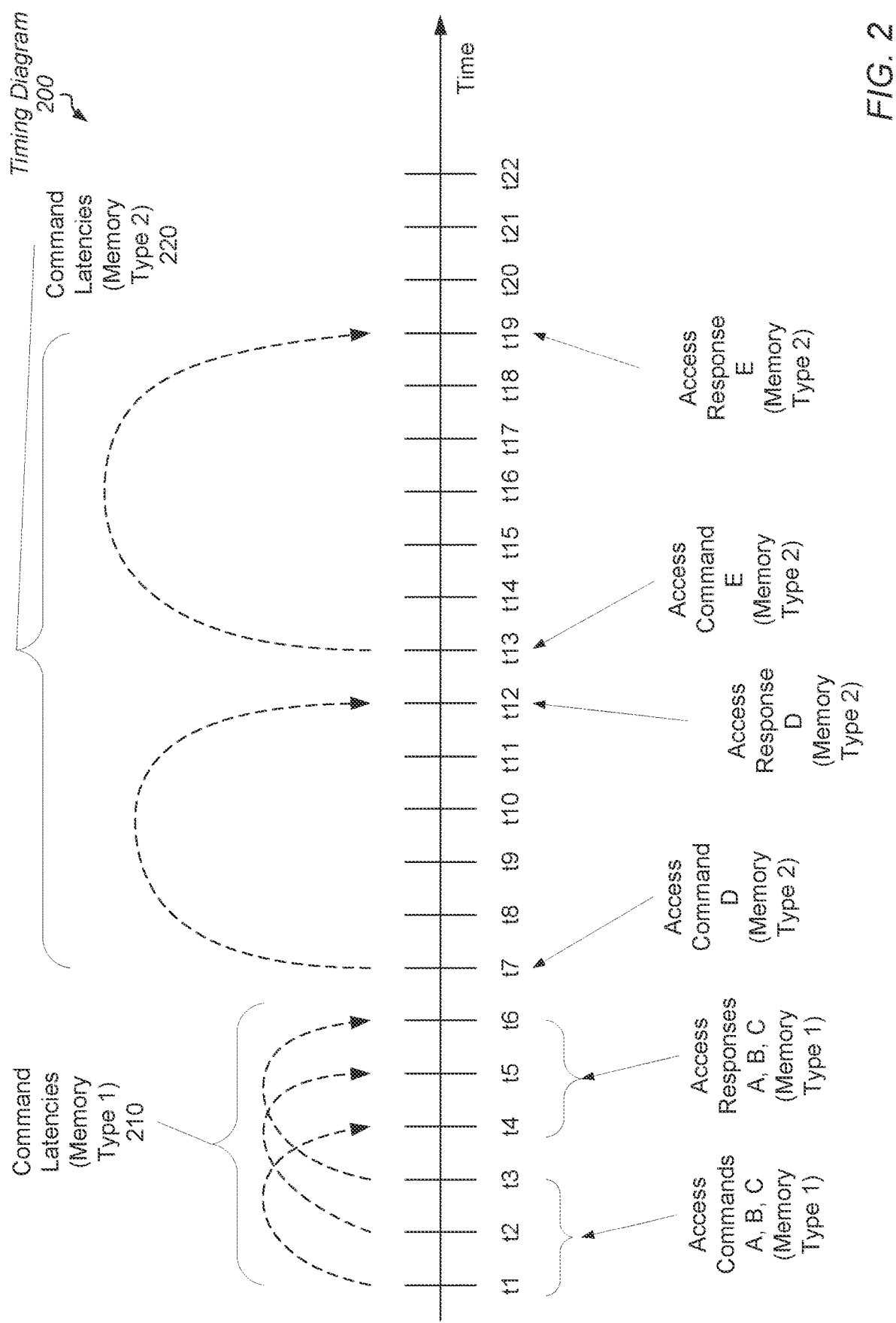
FIG. 2 is a block diagram of one embodiment of a timing diagram.

Referring to FIG. 2, a generalized block diagram of one embodiment of a timing diagram 200 is shown. In the illustrated embodiment, memory access commands are shown to be issued at different times on the time line. The memory access commands are issued to one of two different types of memory with different access latencies. In various embodiments, the first type of memory (Memory Type 1) uses a different data storage technology than the second type of memory (Memory Type 2), and accordingly, Memory Type 1 has an access latency which differs from an access latency of Memory Type 2 by at least a threshold amount of time.

As shown, three memory access commands labeled A, B and C are issued at times indicated by marks t1, t2 and t3. These memory access commands are issued to Memory Type 1. The responses to these memory access commands are shown to arrive at times indicated by marks t4, t5, and t6. In some embodiments, the marks on the timeline are equivalent to clock cycles. In other embodiments, the marks on the timeline are equivalent to other measurements of time indicating given points in time. The responses are shown to arrive in-order relative to the order of issuing the memory access commands A, B and C in addition to having a deterministic access latency of three marks on the timeline.

Additionally, another memory access command D is shown to be issued at a time indicated by mark t7. Memory access command D is issued to Memory Type 2. A response is shown to be received at a time indicated by mark t12. The access latency is greater for memory access command D issued to Memory Type 2 than for the memory access commands A, B and C issued to Memory Type 1. In some embodiments, the access latency for Memory Type 2 is five marks on the timeline.

In the embodiment shown, Memory Type 2 has a second access latency. For example, memory access command E is issued to Memory Type 2 at a time indicated by the mark t13 on the timeline. In some embodiments, the second access latency for Memory Type 2 is six marks on the timeline. As shown, the response to memory access command E is shown to arrive at a time indicated by the mark t19. In some embodiments, read access latencies are equal to write access latencies for Memory Type 1 and Memory Type 2. In other embodiments, read access latencies are different from write access latencies for one for more of Memory Type 1 and Memory Type 2. In the illustrated embodiment, the access commands A-E have different access latencies 210 and 220 and the commands A-E are shown to be issued separately from one another. However, such a scheme for issuing is inefficient.

Figure 3:
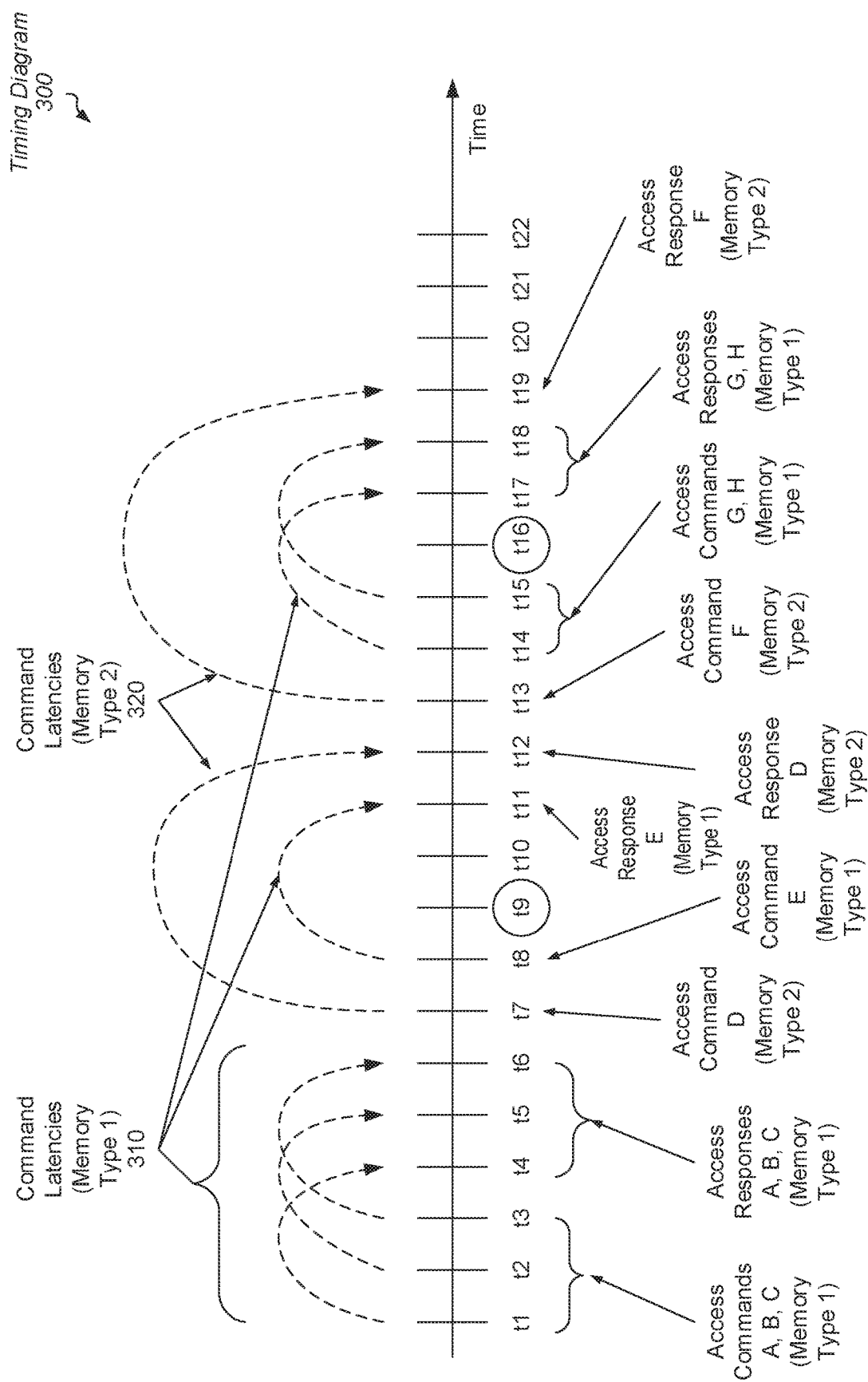
FIG. 3 is a block diagram of another embodiment of a timing diagram.

Referring to FIG. 3, a generalized block diagram of another embodiment of a timing diagram 300 is shown. In the illustrated embodiment, memory access commands are shown to be issued at different times on the time line. The memory access commands are issued to one of two different types of memory with appreciably different access latencies such as differing by at least a threshold amount of time. As shown, the latencies 310 for access commands issued to Memory Type 1 are less than latencies 320 for access commands issued to Memory Type 2.

Similar to timing diagram 200, in some embodiments, the marks on the timeline are equivalent to clock cycles. In other embodiments, the marks on the timeline are equivalent to other measurements of time indicating points in time. As shown, three memory access commands labeled A, B and C are issued at times indicated by marks t1, t2 and t3. These memory access commands are issued to Memory Type 1. The responses to these memory access commands are shown to arrive at times indicated by marks t4, t5, and t6 and are in-order relative to the order of issuing the memory access commands A, B and C in addition to having a deterministic latency of three marks on the timeline.

Memory access command D is issued to Memory Type 2 at a time indicated by mark t7. Before a response is received, another memory access command E is issued to Memory Type 1 at a time indicated by mark t8. At the time indicated by mark t9, it is impossible to issue another memory access command to Memory Type 1 without a data collision. It is known in this example that the access latency for memory access commands issued to Memory Type 1 is three marks on the timeline and the access latency for memory access commands issued to Memory Type 2 is at least five marks on the timeline. Therefore, it is known that the memory data bus is unavailable at the time indicated by mark t12 due to the scheduling of memory access command D. If a memory access command is issued to Memory Type 1 at the time indicated by mark t9, then a data collision would occur at t12.

Other access commands are shown to be issued such as memory access command F issued to Memory Type 2 at time t13 and memory access commands G and H issued to Memory Type 1 at times t14 and t15. The access latency in this example for the memory access command F is six marks on the timeline. Therefore, it is known the memory data bus is unavailable at the time indicated by mark t19 due to the scheduling of status access command F. If a memory access command is issued to Memory Type 1 at the time indicated by mark t16, then a data collision would occur at t19. Therefore, a scheduler issuing memory access commands to two types of memory via a memory channel takes into account when the memory data bus is unavailable due to the latencies for the commands in order to avoid a data collision on the memory data bus.

Figure 4:
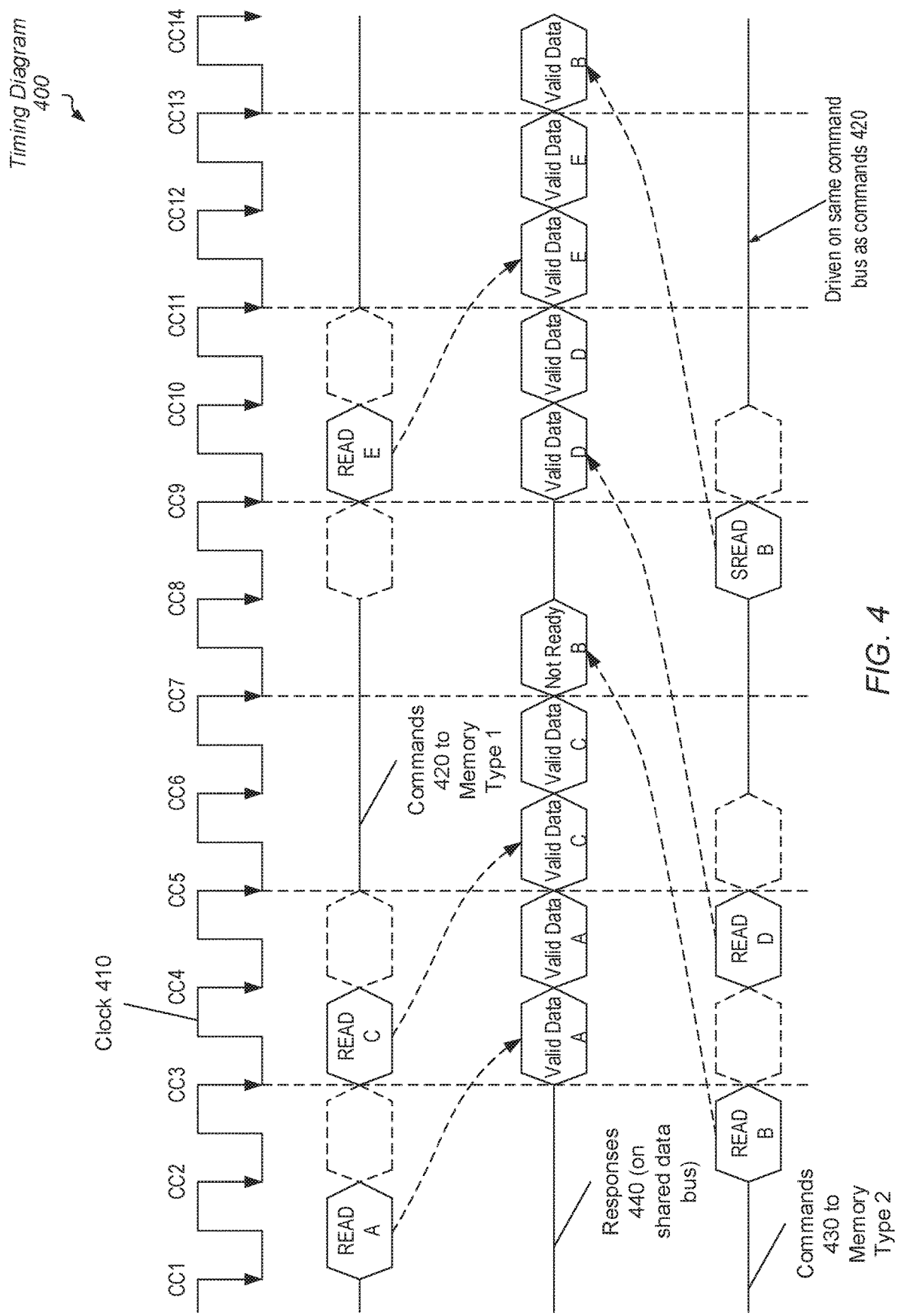
FIG. 4 is a block diagram of another embodiment of a timing diagram.

Referring to FIG. 4, a generalized block diagram of another embodiment of a timing diagram 400 is shown. In the illustrated embodiment, memory access commands 420 and 430 are shown to be issued at different times based on clock 410. In the illustrated embodiment, clock cycles of clock 410 are used to provide measurement of time to identify points in time. The memory access commands are issued to one of two different types of memory with access latencies differing from one another by at least a threshold amount of time. In an embodiment, commands 420 are issued to the first type of memory (Memory Type 1) and commands 430 are issued to the second type of memory (Memory Type 2).

As shown, the latencies for access commands 420 are less than latencies for access commands 430. The latencies are not drawn to scale for ease of illustration. In some embodiments, the access latencies for Memory Type 1 measured from an issue of a read command to a received response with valid data are on a scale of 10's of nanoseconds. In the illustrated example, the latency is shown as 2 clock cycles. In various embodiments, the access latencies for Memory Type 2 measured from an issue of a read or status command to a received response, which may or may not include valid data, is on a scale of 100's of nanoseconds. For ease of illustration, the latency is shown as 5 clock cycles, rather than drawn to scale.

In various embodiments, a memory request, such as a memory read request or a memory write request, is converted into one or more commands based on the memory being accessed. For example, control logic within DRAM performs complex transactions such as activation (opening) transactions and precharge of data and control lines within DRAM once to access an identified row and once to put back the modified contents stored in the row buffer to the identified row during a close transaction. Each of the different DRAM transactions, such as activation/open, column access, read access, write access, and precharge/close, has a different respective latency. Often, the activation and precharge transactions have significantly higher latencies than the read access and write access transactions.

The dashed lines for commands shown in the illustrated example represent possible additional commands issued along with memory access commands. For example, activation/open commands and precharge/close commands for DRAM can be used, but are not shown in timing diagram 400. Similarly, for NVDIMM-P, each of a transaction read (X-READ) command, a send read (SREAD) command, and a speculative status read command is typically followed by an extended address (XADR) command, which allows extending the address for large linear addresses. These additional commands are not specifically shown, but are represented by the dashed lines for possible placement among commands 420 and 430. Therefore, back-to-back access commands typically are not issued on back-to-back clock cycles. A scheduler for a memory controller with a memory channel takes into account the possible additional commands when scheduling memory access commands for issue.

Responses are shown as responses 440 and they are received on a shared single memory data bus. As shown, a memory access command "READ A" for Memory Type 1 is issued at clock cycle (CC) 1. With an access latency of two clock cycles in the example, the valid response data arrives at CC 3. As shown in the example, the valid data consumes two clock cycles such as CC 3 and CC 4. During each clock cycle, an amount of data equal to the data bus width is returned to the memory controller. The supported size of the data bus is based on design choice.

In one embodiment, the scheduler or other control logic in the memory controller determines a next given point in time that the memory data bus is scheduled to be available is after CC 4, which is CC 5. The scheduler determines there is time to schedule a memory access command for Memory Type 1 and a memory access command for Memory Type 2. The amount of response data for a memory access command for Memory Type 1 would not collide with response data arriving for an earlier memory access command for Memory Type 2. Therefore, the scheduler issues a read command "READ B" for Memory Type 2 at CC 2 and a memory access command "READ C" for Memory Type 1 at CC 3. With an access latency of two clock cycles in the example, the valid response data for "READ C" arrives at CC 5 and CC 6. With an access latency of five clock cycles in the example, the valid response data is scheduled to arrive at CC 7 and CC 8 for "READ B." However, as shown, the requested data was not yet ready to be retrieved from Memory Type 2. An indication specifying the requested data is not yet available is received by the memory controller and used by the scheduler to retry at a later time.

The scheduler determines a next given point in time that does not already have read response data scheduled to be driven on the memory data bus is CC 9. The scheduler determines there is time to schedule a memory access command for Memory Type 1 and a memory access command for Memory Type 2. To select the next memory access command to issue, the scheduler uses information such as quality-of-service (QoS) or other priority levels of the memory requests, process or software thread identifiers (IDs) of the memory requests, ages of the memory requests, an amount of time since a memory access command had been issued to Memory Type 1, an amount of time since a memory access command had been issued to Memory Type 2, and so forth. In the provided example, the scheduler issues a read access command "READ D" for Memory Type 2 at CC 4. With an access latency of five clock cycles in the example, the valid response data is scheduled to arrive at CC 9 and CC 10.

The scheduler determines a next given point in time that the memory data bus is available is CC 11. The scheduler determines there is time to schedule a memory access command for Memory Type 1 and a memory access command for Memory Type 2. The scheduler selects the next memory access command to issue based on the earlier criteria such as priority levels, ages and so forth. In some embodiments, the scheduler assigns a given weight to each of the criteria and performs a weighted sum. The memory access command or status access command with the greatest sum is selected for issue.

In an embodiment, the memory controller receives an indication on another channel or link interface that the response data for "READ B" is now available from Memory Type 2. Although the memory access command "READ E" has a higher weighted sum than the send read command "SREAD B" corresponding to the earlier read command "READ B", the scheduler determines the amount of response data for the memory access command "READ E" would collide with response data arriving for the earlier read command "READ D." Therefore, the scheduler issues the send read command "SREAD B" at CC 8 and the memory access command "READ E" at CC 9. With an access latency of two clock cycles in the example, the valid response data for "READ E" arrives at CC 11 and CC 12. With an access latency of five clock cycles for "SREAD B" in the example, the valid response data is scheduled to arrive at CC 13 and CC 14 (not shown). Although timing diagram 400 is described with respect to read access commands, in other embodiments, a similar timing diagram is used for write access commands where write data is placed on the shared memory data bus and data collisions can occur with either read response data or other write data of other write access commands.

In some embodiments, the received response data includes a tag or other identifier identifying which command is associated with the response data. In other embodiments, the timing of the arrival of the request data is used to identify which command is associated with the response data. Therefore, although the request data arrives out-of-order corresponding to the issue of commands, the scheduler in the memory controller is able to keep track of which received data belongs with which command.

Figure 5:
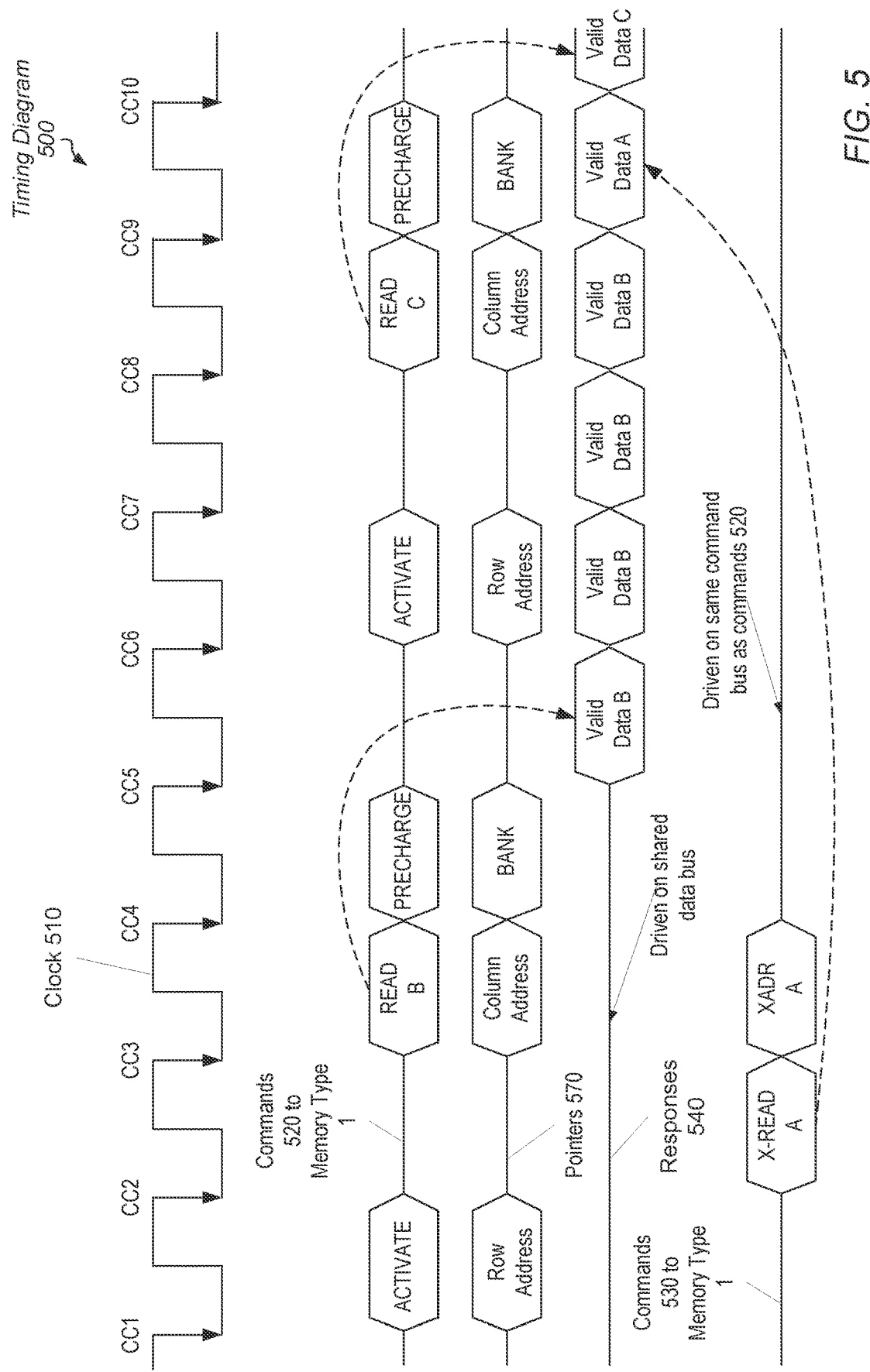
FIG. 5 is a block diagram of another embodiment of a timing diagram.

Referring to FIG. 5, a generalized block diagram of another embodiment of a timing diagram 500 is shown. In the illustrated embodiment, memory access commands 520 and 530 are shown to be issued at different times based on clock 510. In the illustrated embodiment, clock cycles of clock 510 are used to provide measurement of time to identify points in time. The memory access commands are issued to one of two different types of memory with different access latencies. In an embodiment, commands 520 are issued to the first type of memory, which is conventional DRAM, and commands 530 are issued to the second type of memory, which is NVDIMM-P. However, other types of memory with different access latencies are possible and contemplated.

The command latencies are not drawn to scale for ease of illustration. In some embodiments, the command latencies for conventional DRAM are on a scale of 10's of nanoseconds. In the illustrated example, the latency is shown as 2 clock cycles. In various embodiments, the access latencies for NVDIMM-P are on a scale of 100's of nanoseconds. In the illustrated example, the latency is shown as 7 clock cycles. In various embodiments, a memory request, such as a memory read request, is converted into one or more commands based on the memory being accessed. As described earlier, control logic within DRAM performs complex transactions as activate and close transactions. In addition, other signals are generated such as strobes for a row address and strobes for a column address.

Similar to the earlier timing diagram 400, timing diagram 500 is described with respect to read access commands. However, in other embodiments, a similar timing diagram is used for write access commands where write data is placed on the shared memory data bus and data collisions can occur with either read response data or other write data of other write access commands. Responses are shown as responses 540 and they are received on a single memory data bus. The scheduler selects the next memory access command to issue based on the earlier criteria such as priority levels, ages and so forth. In some embodiments, the scheduler assigns a given weight to each of the criteria and performs a weighted sum to use when selecting the next command to issue.

As shown, the scheduler issues a transaction read command "X-READ A" for Memory Type 2 at CC 2. An extended address command "XADR A," which allows extending the address for large linear addresses, immediately follows at CC 3. With an access latency of 7 clock cycles in the example, the valid response data is scheduled to arrive at CC 9. In some embodiments, the latency is measured from the command "XADR A," rather than from the command "X-READ A." In various embodiments, the requested data consumes multiple clock cycles. However, for ease of illustration, the requested data for the command "X-READ A" consumes a single clock cycle.

The scheduler issues a memory access command "READ B" for Memory Type 1 at CC 3. With an access latency of two clock cycles in the example, the valid response data arrives at CC 5. As shown, an activate command "ACTIVATE" is issued at CC 1 to prepare for issuing the command "READ B" at CC 3. The column address strobe (CAS) is asserted with a logic low value at CC 3. The row address and the column address are provided on the address lines marked as pointers 570 aligned with the assertions of the corresponding strobes. As shown, the requested data for the command "READ B" consumes four clock cycles such as CC 5, CC 6, CC 7 and CC 8. The scheduler takes into account the number of clock cycles consumed by received requested data when determining a next given point in time that the memory data bus is available.

In one embodiment, the scheduler determines a next given point in time that the memory data bus is available is CC 10. The scheduler determines there is time to schedule a memory access command for Memory Type 1, but there is not time to schedule a memory access command for Memory Type 2. As shown, the earliest point in time to issue a next memory access command for Memory Type 2 is after the command "XADR A", which is CC 4. With a command latency of 7 clock cycles, the requested data is scheduled to arrive at CC 11, rather than CC 10. Therefore, the scheduler issues a memory access command "READ C" for Memory Type 1 at CC 8. With an access latency of two clock cycles in the example, the valid response data arrives at CC 10.

As shown, precharge command "PRECHARGE" and an activate command "ACTIVATE" are issued at CC 4 and CC 6, respectively, to prepare for issuing the command "READ C" at CC 8. The bank to close is specified in the "BANK" data on the address lines marked as pointers 570. In some embodiments, the received response data includes a tag or other identifier identifying which command is associated with the response data. In other embodiments, the timing of the arrival of the request data is used to identify which command is associated with the response data. Therefore, although the request data arrives out-of-order corresponding to the issue of commands, the scheduler in the memory controller is able to keep track of which received data belongs with which command.

Figure 6:
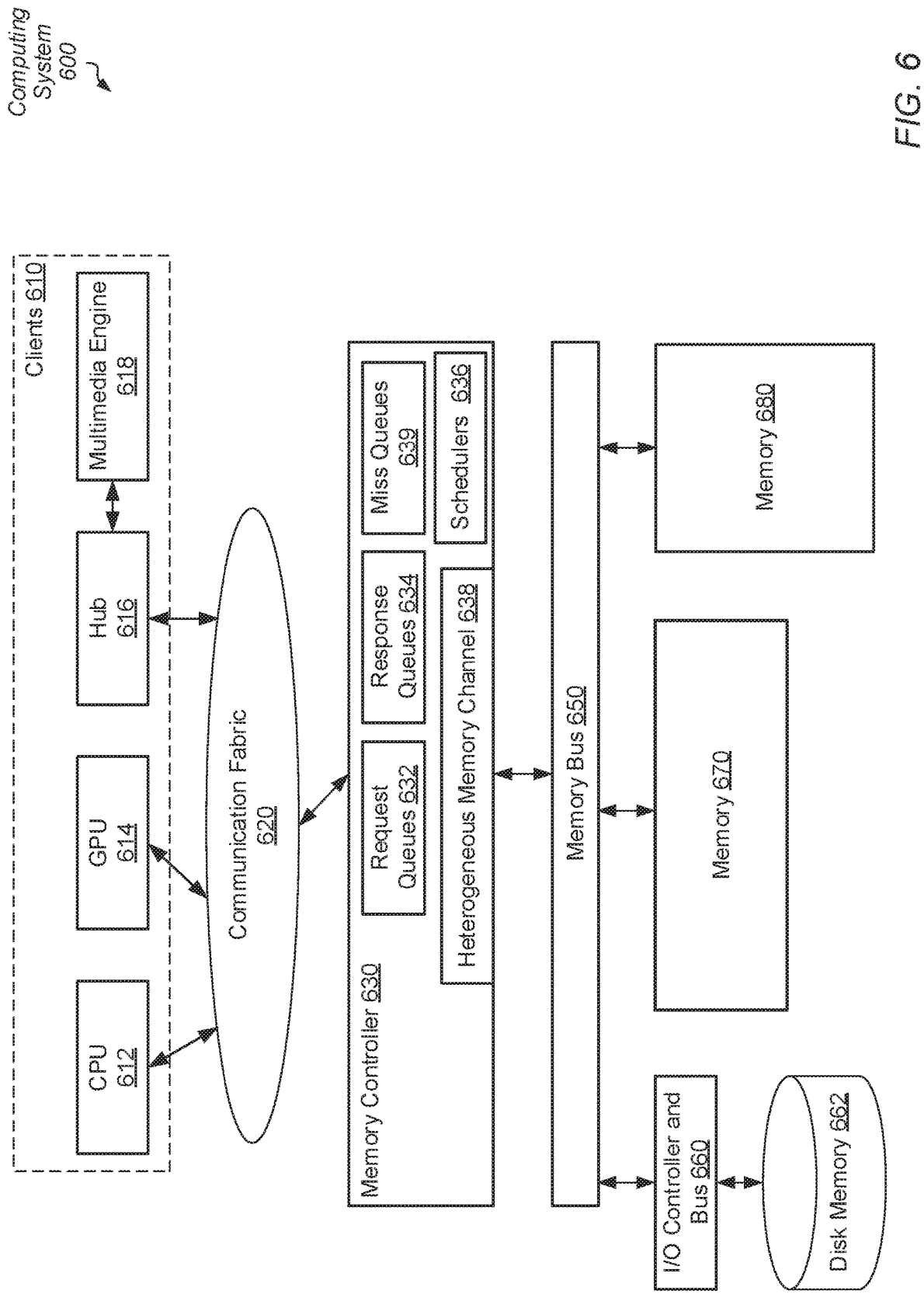
FIG. 6 is a block diagram of another embodiment of a computing system.

Referring to FIG. 6, a generalized block diagram of another embodiment of a computing system 600 is shown. As shown, computing system 600 includes communication fabric 620 between each of clients 610 and memory controller 630. Memory controller 630 includes a memory channel 638 for transferring memory traffic between memory controller 620 and memory 670 and memory 680 via memory bus 650. Each of memory 670 and memory 680 store data accessed by clients 610. In some embodiments, the components of system 600 are individual dies on an integrated circuit (IC), such as a system-on-a-chip (SOC). In other embodiments, the components are individual dies in a system-in-package (SiP) or a multi-chip module (MCM). A power controller, an interrupt controller, network link interfaces and so forth, are not shown for ease of illustration.

In various embodiments, memory bus 650 utilizes a bi-directional shared-bus structure. In various embodiments, memory 670 and memory 680 use different data storage technology, and accordingly, memory 670 has access latencies differing from access latencies of memory 680 by at least a threshold amount of time. In various embodiments, one or more of memory 670 and memory 680 is used as system memory by clients 610.

In an embodiment, when one of memory 670 and memory 680 is one of a variety of types of DRAM, one example of a protocol for a respective interface between memory channel 638 and the memory controller 630 is a double data rate (DDR) type of protocol. The protocol determines values used for information transfer, such as a number of data transfers per clock cycle, signal voltage levels, signal timings, signal and clock phases and clock frequencies. Protocol examples include DDR2 SDRAM, DDR3 SDRAM, GDDR4 (Graphics Double Data Rate, version 4), SDRAM, GDDR5, SDRAM, GDDR6, HBM2, and so forth. The memory controller 630 includes control circuitry for interfacing to memory channel 638 and other memory channels (not shown) and following a corresponding protocol.

Although a single memory controller 630 is shown, in other embodiments, another number of memory controllers are used in computing system 600. As shown, memory controller 630 includes request queues 632 for queuing memory access requests received from clients 610 via communication fabric 620. Memory controller 630 also has response queues 634 for storing responses received from memory 670 and memory 680. In an embodiment, request queues 632 include a separate read queue for each of memory 670 and memory 680 for storing memory read requests. In addition, request queues 632 include a separate write queue for each of memory 670 and memory 680 for storing memory write requests. In some embodiments, memory controller 630 also includes miss queues 639 when one or more of memory 670 and memory 680 includes a data storage technology that provides a miss status as a response to an access. In an embodiment, one of memory 670 and memory 680 is NVDIMM-P, which provides the miss status response.

In some embodiments, request queues 632 include one or more queues for storing received memory access requests and a separate queue for storing scheduled memory access commands converted from the received requests and selected from the one or more queues. Schedulers 636 include control logic for selecting memory access commands stored in request queues 632 for out-of-order issue to memory 670 and memory 680. Therefore, memory controller 630 supports out-of-order issue of the memory access requests to memory 670 and memory 680.

In various embodiments, schedulers 636 in memory controller 130 schedule the issue of the stored memory access commands based on a quality-of-service (QoS) or other priority information, age, a process or thread identifier (ID), an amount of time since a memory access command had been issued to memory 670, an amount of time since a memory access command had been issued to memory 680, and a relationship with other stored requests such as targeting a same memory channel, targeting a same rank, targeting a same bank and/or targeting a same page. In some embodiments, schedulers 636 assign a given weight to each of the criteria and perform a weighted sum. The memory access command or status access command with the greatest sum is selected for issue.

In various embodiments, communication fabric 620 transfers traffic back and forth between clients 610 and memory controller 630 and includes interfaces for supporting respective communication protocols. In some embodiments, communication fabric 620 includes at least queues for storing requests and responses, selection logic for arbitrating between received requests before sending requests across an internal network, logic for building and decoding packets, and logic for selecting routes for the packets.

In the illustrated embodiment, clients 610 include central processing unit (CPU) 612, graphics processing unit (GPU) 614 and Hub 616. Hub 616 is used for communicating with Multimedia Engine 618. The CPU 612, GPU 614 and Multimedia Engine 618 are examples of computing resources capable of processing applications. Although not shown, in other embodiments, other types of computing resources are included in clients 610. In some embodiments, each of the one or more processor cores in CPU 612 includes circuitry for executing instructions according to a given selected instruction set architecture (ISA). In various embodiments, each of the processor cores in CPU 612 includes a superscalar, multi-threaded microarchitecture used for processing instructions of the given ISA.

In an embodiment, GPU 614 includes a high parallel data microarchitecture with a significant number of parallel execution lanes. In one embodiment, the microarchitecture uses single-instruction-multiple-data (SIMD) pipeline for the parallel execution lanes. Multimedia Engine 618 includes processors for processing audio data and visual data for multimedia applications. In some embodiments, the address space of computing system 600 is divided among at least CPU 612, GPU 614 and Hub 616 and one or more other components such as input/output (I/O) peripheral devices (not shown) and other types of computing resources. Memory maps are maintained for determining which addresses are mapped to which component, and hence to which one of CPU 612, GPU 614 and Hub 616 a memory request for a particular address should be routed.

In various embodiments, one or more of memory 670 and memory 680 are filled with data from disk memory 662 through the I/O controller and bus 660 and the memory bus 650. A corresponding cache fill line with the requested block is conveyed from one or more of memory 670 and memory 680 to a corresponding one of the cache memory subsystems in clients 610 in order to complete the original memory access request. The cache fill line is placed in one or more levels of caches. In an embodiment, disk memory 662 provides a non-volatile, secondary storage of data. In one embodiment, disk memory 662 includes one or more hard disk drives (HDDs). In other embodiments, disk memory 662 includes solid-state disks (SSDs).

Figure 7:
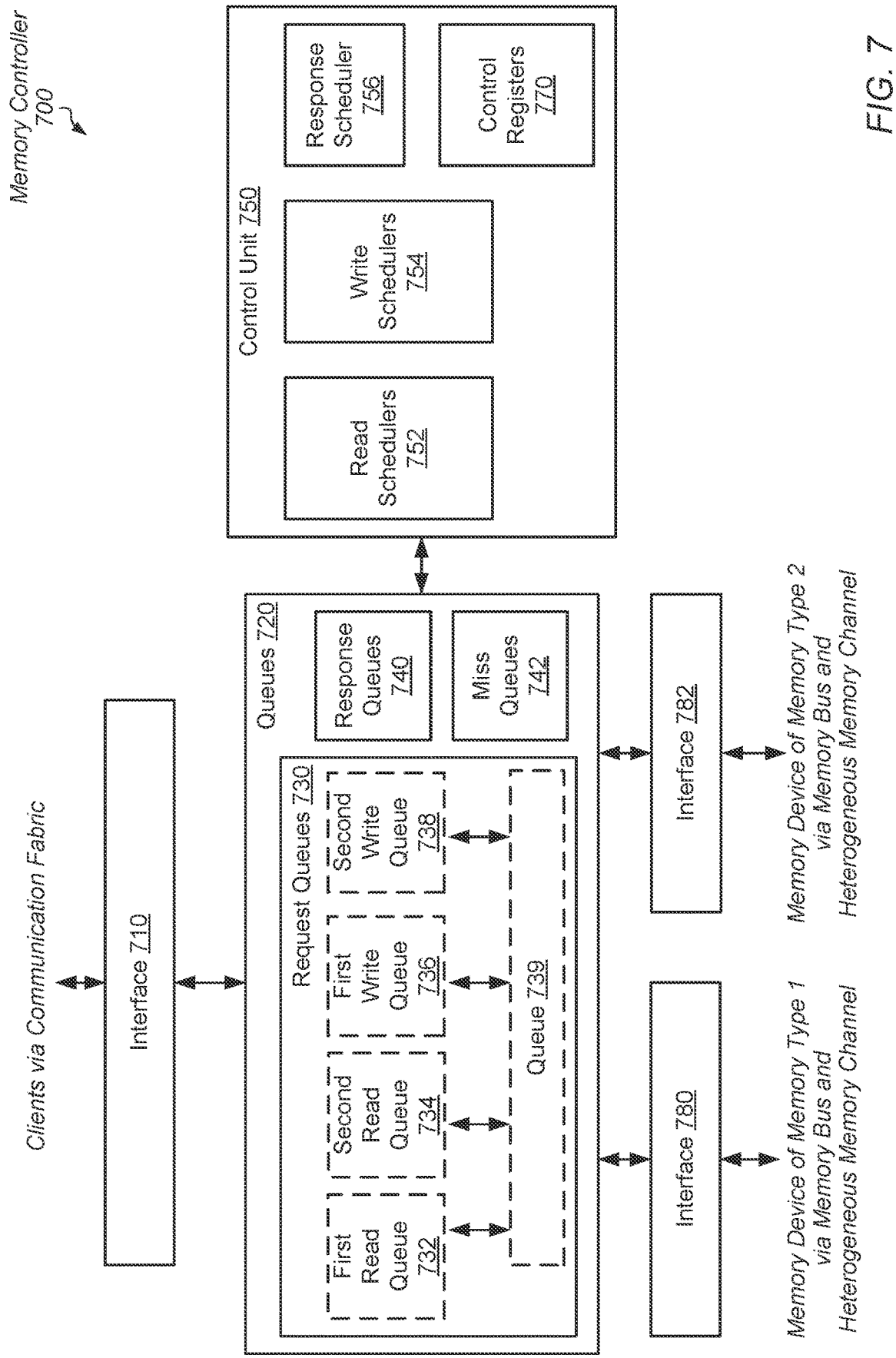
FIG. 7 is a block diagram of one embodiment of a memory controller.

Referring to FIG. 7, a generalized block diagram of one embodiment of a memory controller 700 is shown. In the illustrated embodiment, memory controller 700 includes an interface 710 to clients via a communication fabric, queues 720 for storing received memory access requests and received responses, control unit 750 and an interface 780 to multiple memory devices, each using different memory technologies, via a memory data bus and a memory channel. Each of interfaces 710, 780 and 782 supports respective communication protocols. In an embodiment, interface 780 is an interface to a memory command bus for sending memory access commands corresponding to memory requests received via interface 710 to a memory device, which includes data storage technology of a first memory type. In one embodiment, interface 782 is an interface to a memory data bus for transferring data between the memory controller 700 and another memory device, which includes data storage technology of a second memory type different from the first memory type. In various embodiments, an access latency of the first memory type differs from an access latency of the second memory type by at least a threshold amount of time.

In the illustrated embodiment, queues 720 includes request queues 730, response queues 740, and miss queues 742. In an embodiment, queues 720 include first read queue 732 for storing received read requests targeting a first memory type and second read queue 734 for storing received read requests targeting a second memory type. Although two read queues are shown for receiving read requests targeting two different memory types, in other embodiments, another number of read queues are used for receiving read requests targeting another number of different memory types. In addition, queues 720 include first write queue 736 for storing received write requests targeting the first memory type and second write queue 738 for storing received write requests targeting the second memory type. In some embodiments, queues 720 also includes miss queues 742 when one or more of the first memory type and the second memory type include a data storage technology that provides a miss status as a response to an access. In an embodiment, one of the first memory type and the second memory type is NVDIMM-P, which provides the miss status response. In one embodiment, queues 720 includes queue 739 for storing scheduled memory access requests selected from one or more of queues 732-738 or a unified queue if one is used.

In some embodiments, read schedulers 752 include arbitration logic for selecting read requests from first read queue 732 out-of-order as well as for selecting read requests from second read queue 734 out-of-order. In an embodiment, read schedulers 752 select a request from either first read queue 732 or second read queue 734 when a respective request is available for scheduling in a given clock cycle from either first read queue 732 or second read queue 734. In some embodiments, read schedulers 752 schedule read requests for out-of-order issue to one of the first memory type and the second memory type based on a quality-of-service (QoS) or other priority information, age, a process or thread identifier (ID), and a relationship with other stored requests such as targeting a same memory channel, targeting a same rank, targeting a same bank and/or targeting a same page.

To avoid data collisions on the memory data bus despite multiple deterministic access latencies for the first memory type and the second memory type, in one embodiment, read schedulers 752 determine a next given point in time that the memory data bus is available. In some embodiments, points in time are measured by clock cycles. Read schedulers 752 determine whether there is sufficient time to schedule a first memory access command corresponding to a selected read request stored in first read queue 732 to provide response data at the given point in time. Additionally, read schedulers 752 also determine whether there is sufficient time to schedule a second memory access command corresponding to a selected read request stored in second read queue 734 to provide response data at the given point in time. In other words, read schedulers 752 determine whether a new memory access command received by either first read queue 732 or second read queue 734 can be scheduled for issue to either the first memory device or the second memory device such that a response to the new memory access command will be received on the memory data bus at the given point in time. In various embodiments, the given point in time is a next available point in time in which the memory data bus is not scheduled to have data driven on the memory data bus and has not yet been considered for scheduling.

Although, in some embodiments, the access latencies for one or more of the first memory type and the second memory type are non-deterministic, responses have deterministic latencies. Responses are returned after a deterministic latency with an indication specifying whether valid data is included in the response. If valid data is not included in the response, a retry is attempted later. Therefore, the memory access command is stored in miss queues 742 for a later retry. As described earlier, other commands are at times additionally used along with the memory access commands. These other commands also add latency to the latency of the memory access command.

If there is sufficient time to issue at least one of the first access command and the second access command to provide response data on the memory data bus at the given point in time, read schedulers 752 select one of the first memory access command and the second memory access command. The criteria described earlier, such as priority levels, ages, and so forth, can be used by scheduler 752. In addition, weighted values can be used. In an embodiment, read schedulers 752 place the selected access command in queue 739 prior to sending the selected access command to the corresponding memory type via the memory channel. In order to determine whether a new pending memory access command stored in either of first read queue 732 or second read queue 734 can be scheduled for issue at the given point in time, read schedulers 752, in an embodiment, determine a response latency for the new memory access command is N clock cycles, where N is an integer. Read schedulers 752 identify an earlier point in time that corresponds to N clock cycles before the given point in time, and determine whether the memory command bus is available at the earlier point in time.

If read schedulers 752 determine there is sufficient time for the above new memory access command to be scheduled, then read schedulers 752 schedule the new memory access command for issue at the earlier point in time and store an indication that the memory data bus is unavailable at the given point in time. In some embodiments, a vector of bits are stored in registers to indicate which points in time the memory data bus is available and which points in time the memory data bus are unavailable. For example, in various embodiments each bit of the vector of bits corresponds to a particular time slot. If a scheduler determine that data is to be conveyed during a given time slot(s) (e.g., write data to be transferred to the memory, or read data being retrieved from the memory), the scheduler sets the corresponding time slot bit(s) in the vector to indicate the data bus is scheduled to be busy at that time. For example, in some embodiments, a bit with a value of "0" indicates no data is scheduled to be on the data bus at that time (i.e., the data bus is non-busy). In such an embodiment, setting a bit of the time slot causes the bit to have a value of "1". In other embodiments, these values may be reversed such that a "0" indicates a busy period on the data bus and a "1" indicates a non-busy period. In such an embodiment, setting a bit would cause the bit to have a value of "1". By referencing the vector of bits, the scheduler can quickly determine whether or not a given time slot is available for purposes of scheduling new activity. In an embodiment, a register is used to store an indication that specifies which points in time have not yet been considered for scheduling and which points in time have been considered for scheduling. In various embodiments, these stored indications can be used to determine other given points in time for future scheduling of commands for issue.

In some embodiments, to avoid data collisions on the memory data bus despite multiple deterministic access latencies for the first memory type and the second memory type, read schedulers 752 determine a next point in time that the memory command bus is available in contrast to initially determining a next given point in time that the memory data bus is available. Again, in some embodiments, points in time are measured by clock cycles. In some embodiments, read schedulers 752 determine a respective given point in time for each different type of pending memory access command stored in first read queue 732 and second read queue 734 by adding the respective latencies to the next point in time that the memory command bus is available.

In order to determine whether a new pending memory access command stored in either of first read queue 732 or second read queue 734 can be scheduled for issue at the next point in time that the memory command bus is available, read schedulers 752, in an embodiment, determine a response latency for the new memory access command is N clock cycles, where N is an integer. Read schedulers 752 identify a later given point in time that corresponds to N clock cycles after the point in time that the memory command bus is available. Afterward, read schedulers 752 determine whether the memory data bus is available at the later given point in time.

In some embodiments, read schedulers 752 use the stored vector of bits as described earlier to determine whether the memory data bus is available for each of the respective one or more given points in time for each of the one or more pending memory access commands stored in first read queue 732 and second read queue 734. If the memory data bus is available during a respective given point in time for only a single pending memory access command, then read schedulers 752 schedule that single pending memory access command at the next point in time that the memory command bus is available. If the memory data bus is available during respective given points in time for multiple pending memory access commands, then read schedulers 752 select one of the pending memory access commands to issue based on criteria described earlier such as priority levels, ages and so forth. Read schedulers 752 schedule the selected pending memory access command at the next point in time that the memory command bus is available.

Write schedulers 754 include similar selection logic for first write queue 736 and second write queue 738 as used by read schedulers 752. In various embodiments, write schedulers 754 also consider data collisions caused by data driven on the shared memory data bus. The control logic implementing decision algorithms used by read schedulers 752 is also used by write schedulers 754. In an embodiment, response scheduler 756 includes similar logic for issuing, based on priorities, responses out-of-order to clients. In some embodiments, the received response data includes a tag or other identifier that the response scheduler 756 uses to identify which command stored in either first read queue 732 or second read queue 734 is associated with the response data. In other embodiments, the timing of the arrival of the request data on the memory data bus is used by response scheduler 756 to identify which command is associated with the response data. Therefore, although the request data arrives out-of-order corresponding to the issue of commands, the response scheduler 756 is able to keep track of which received data belongs with which command.

In some embodiments, when read schedulers 752 schedule a given command to issue, response scheduler 756 determines a given point in time for requested read data to be scheduled to arrive on the shared memory data bus. In an embodiment, response scheduler 756 adds the latency of the given command to a point in time the read schedulers 752 schedule to issue the given command. In some embodiments, response scheduler 756 generates an identifier. In some embodiments, the identifier is an indication of the entry in a request queue storing information corresponding to the given command. In other embodiments, the identifier is a combination of one or more of a thread identifier and a portion of a target address of the memory request corresponding to the given command. Response scheduler 756 stores an association of the identifier with the given point in time. In an embodiment, a table is used. Therefore, response scheduler 756 is able to identify the given command with arriving requested read data on the shared memory data bus based on the given point in time, rather than based on a tag inserted in the given command or with a packet associated with the arriving requested read data.

In some embodiments, control registers 770 store an indication of a current mode. For example, the off-chip memory data bus and memory device support either a read mode or a write mode at a given time. Therefore, traffic is routed in a given single direction during the current mode and changes direction when the current mode is changed after a data bus turnaround latency. In various embodiments, control registers 770 store a threshold number of read requests (read burst length) to send during the read mode. In some embodiments, control registers 770 store weights for criteria used by selection algorithms in read schedulers 752 and write schedulers 754 for selecting requests stored in queues 732-738 to issue.

Figure 8:
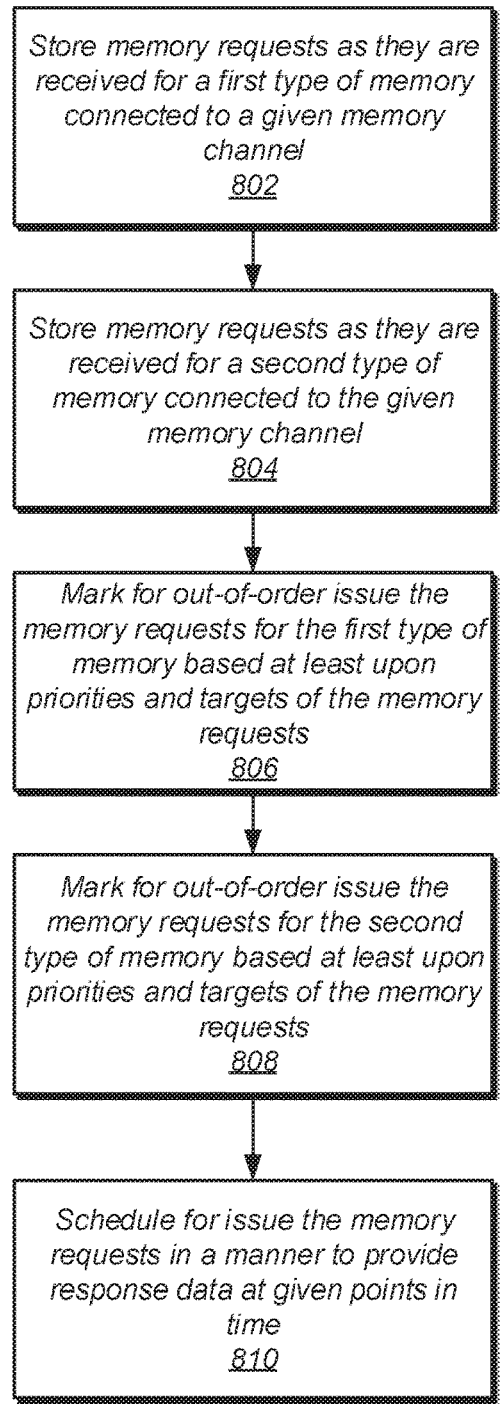
FIG. 8 is a flow diagram of one embodiment of a method for scheduling memory requests for issue to two different memory types.

Referring now to FIG. 8, one embodiment of a method 800 for scheduling memory requests for issue to two different memory types is shown. For purposes of discussion, the steps in this embodiment (as well as in FIGS. 9-14) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 800.

One or more clients within the nodes execute computer programs, or software applications. The computing resource determines a given memory access request misses within a cache memory subsystem within a given client of the one or more clients. The client sends the memory access request to system memory implemented by two different memories via a memory controller with a memory channel connected to each of the two different memories. The differences between one or more access latencies of a first type of memory and one or more access latencies of a second type of memory exceed a threshold amount of time. Memory requests for the first type of memory connected to a given memory channel are stored as they are received (block 802). Memory requests for the second type of memory connected to the given memory channel are stored as they are received (block 804).

The memory requests for the first type of memory are marked for out-of-order issue based at least upon priorities and targets of the memory requests (block 806). The memory requests for the second type of memory are marked for out-of-order issue based at least upon priorities and targets of the memory requests (block 808). Therefore, the memory controller supports out-of-order issue for each of the first memory and the second memory. The memory requests are scheduled for issue in a manner to provide response data at given points in time (block 810). For example, the memory requests are scheduled in an intermixed manner without data collision on the shared memory data bus despite the different access latencies.

In various embodiments, a scheduler or other control logic in the memory controller determines whether there are two pending memory access commands such as a first command for the first memory type and a second command for the second memory type. The scheduler determines whether each of the first command and the second command can be issued without causing a data collision on the shared memory data bus. For example, based on the point in time for issuing a selected command of the first command and the second command in addition to the access latencies of each of the first type of memory and the second type of memory, the memory controller keeps track of points in time when read response data or write data is scheduled to arrive on the shared memory data bus. In some embodiments, points in time are measured by clock cycles.

If selecting either of the first command and the second command would not schedule a data collision on the shared memory data bus, then each of the first command and the second command remains a candidate for issue. In such a case, the scheduler selects a command from the first command and the second command based on arbitration logic. In other embodiments, determining whether to issue the first command or the second command begins with selecting a particular given point in time for the read response data or the write data to be driven on the shared memory data bus.

Figure 9:
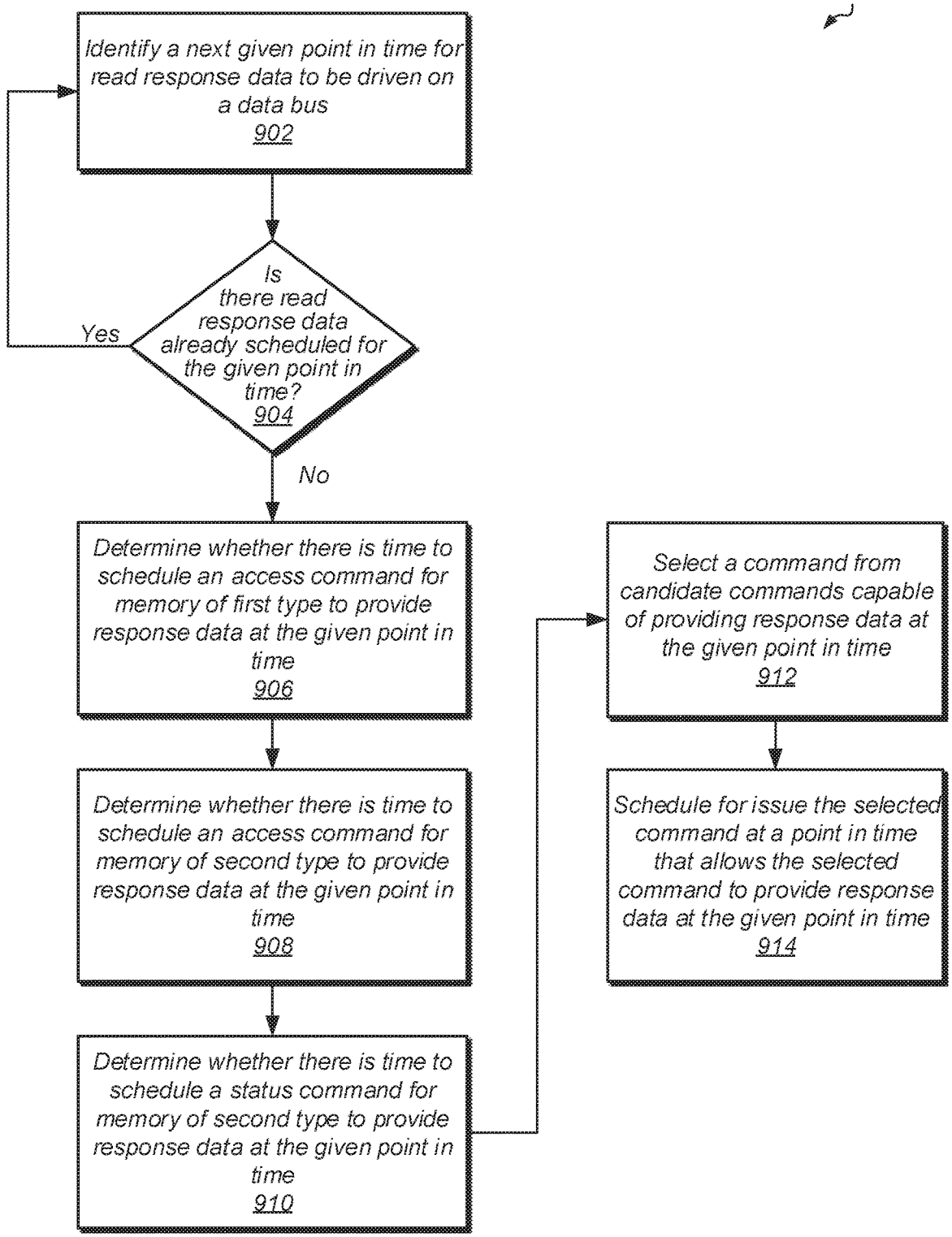
FIG. 9 is a flow diagram of another embodiment of a method for scheduling memory requests for issue to two different memory types.

Turning now to FIG. 9, one embodiment of a method 900 for scheduling memory requests for issue to two different memory types is shown. A next given point in time for read response data to be driven on a memory data bus is identified (block 902). For example, both an access latency and a scheduled amount of requested data to return for each issued memory access command and status access command are considered when determining the next given point in time. In some embodiments, the points in time are measured by clock cycles.

If read response data is already scheduled to arrive for the given point in time ("yes" branch of the conditional block 904), then control flow of method 900 returns to block 902 where a next given point in time is identified. For example, the next clock cycle after the currently selected clock cycle is considered. Alternatively, a count is added to the current clock cycle equal to a given number of clock cycles to be consumed for read requested data scheduled to arrive from one of two different memories. If read response data is not scheduled to arrive for the given point in time ("no" branch of the conditional block 904), then it is determined whether there is sufficient time to schedule a memory access command for a first memory type to provide response data at the given point in time (block 906). Following, it is determined whether there is sufficient time to schedule a memory access command for a second memory type different from the first memory type to provide response data at the given point in time (block 908).

In some embodiments, it is also determined whether there is sufficient time to schedule a status access command for the second memory type to provide response data at the given point in time (block 910). In some embodiments, the access latency for the status access command is different than the access latency for the memory access command for the second memory type. A command is selected from candidate commands capable of providing response data at the given point in time (block 912). In various embodiments, a scheduler selects the next memory access command or status access command to issue based on criteria described earlier such as priority levels, ages and so forth. The selected command is scheduled for issue at a point in time that allows the selected command to provide response data at the given point in time (block 914). For example, a scheduler for a memory controller with a memory channel takes into account the possible additional commands used to prepare the selected command to issue and their respective latencies when scheduling memory access commands and status access commands for issue.

As described above, method 900 describes steps to avoid data collisions on the memory data bus despite multiple deterministic access latencies for the first memory type and the second memory type. However, as described earlier, in other embodiments, the scheduler for the memory controller with a memory channel determines a next point in time that the memory command bus is available in contrast to initially determining a next given point in time that the memory data bus is available. In some embodiments, points in time are measured in clock cycles. In some embodiments, the scheduler determines a respective given point in time for each different type of pending memory access command by adding the respective latencies to the next point in time that the memory command bus is available.

In order to determine whether a new pending memory access command can be scheduled for issue at the next point in time that the memory command bus is available, the scheduler, in an embodiment, determines a response latency for the new memory access command is N clock cycles, where N is an integer. The scheduler identifies a later given point in time that corresponds to N clock cycles after the point in time that the memory command bus is available. Afterward, the scheduler determines whether the memory data bus is available at the later given point in time.

If the memory data bus is available during a respective given point in time for only a single pending memory access command, then the scheduler schedules that single pending memory access command at the next point in time that the memory command bus is available. If the memory data bus is available during respective given points in time for multiple pending memory access commands, then the scheduler selects one of the pending memory access commands to issue based on criteria described earlier such as priority levels, ages and so forth. The scheduler schedules the selected pending memory access command at the next point in time that the memory command bus is available.

The following descriptions for methods 1000-1200 describe steps for initially determining a next given point in time that the memory data bus is available followed by determining an earlier point in time to schedule a memory access command to issue on the memory command bus. However, in various other embodiments, as described above, the scheduler determines a next point in time that the memory command bus is available followed by determining a later point in time for read response data to be scheduled to arrive on the memory data bus without collision. Although the steps in methods 1000-1200 are described with respect to read access commands, in other embodiments, similar logic and steps are used for write access commands where write data is placed on the shared memory data bus and data collisions can occur with either read response data or other write data of other write access commands being driven on the shared memory data bus.

Figure 10:
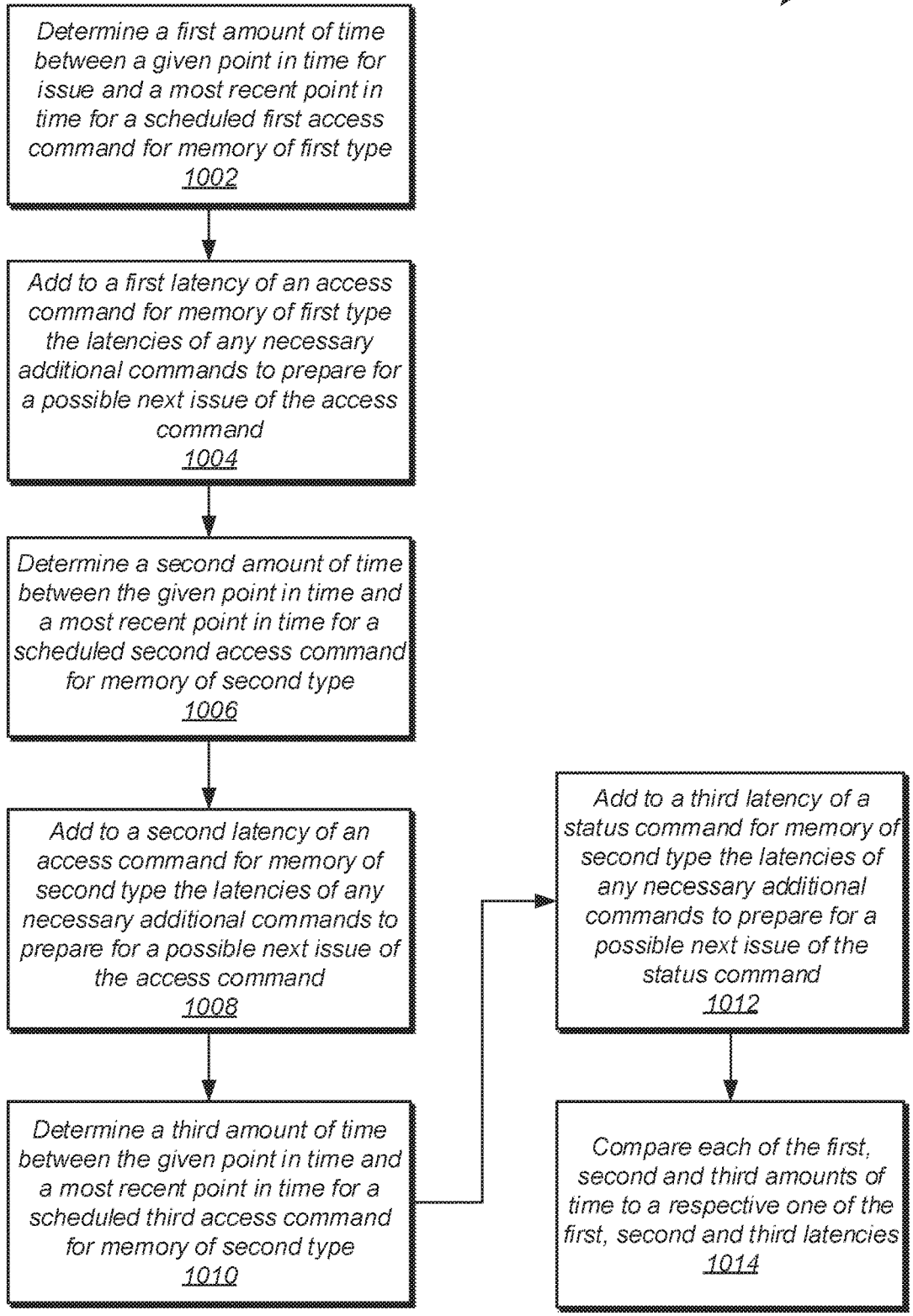
FIG. 10 is a flow diagram of another embodiment of a method for scheduling memory requests for issue to two different memory types.

Turning now to FIG. 10, one embodiment of a method 1000 for scheduling memory requests for issue to two different memory types is shown. In order to select an access command and schedule the access command for issue at a point in time that allows the selected access command to provide response data at a targeted given point in time, particular timing values are evaluated. In some embodiments, the following steps are performed after block 914 of method 900 (of FIG. 9). A first amount of time is determined between a given point in time for command issue and a most recent point in time for a scheduled first access command for a first memory type (block 1002). The latencies of any necessary additional commands to prepare for a possible next issue of the access command for the first memory type are added to a first latency of the access command for the first memory type (block 1004). Similar steps are performed for an access command for a second memory type. For example, a second amount of time is determined between the given point in time and a most recent point in time for a scheduled second access command for the second memory type (block 1006). The latencies of any necessary additional commands to prepare for a possible next issue of the access command for the second memory type are added to a second latency of the access command for the second memory type (block 1008).

A third amount of time is determined between the given point in time and a most recent point in time for a scheduled third access command for the second memory type (block 1010). The latencies of any necessary additional commands to prepare for a possible next issue of the third access command for the second memory type are added to a third latency of the third access command for the second memory type (block 1012). Each of the first, second and third amounts of time is compared to a respective one of the first, second and third latencies (block 1014).

Figure 11:
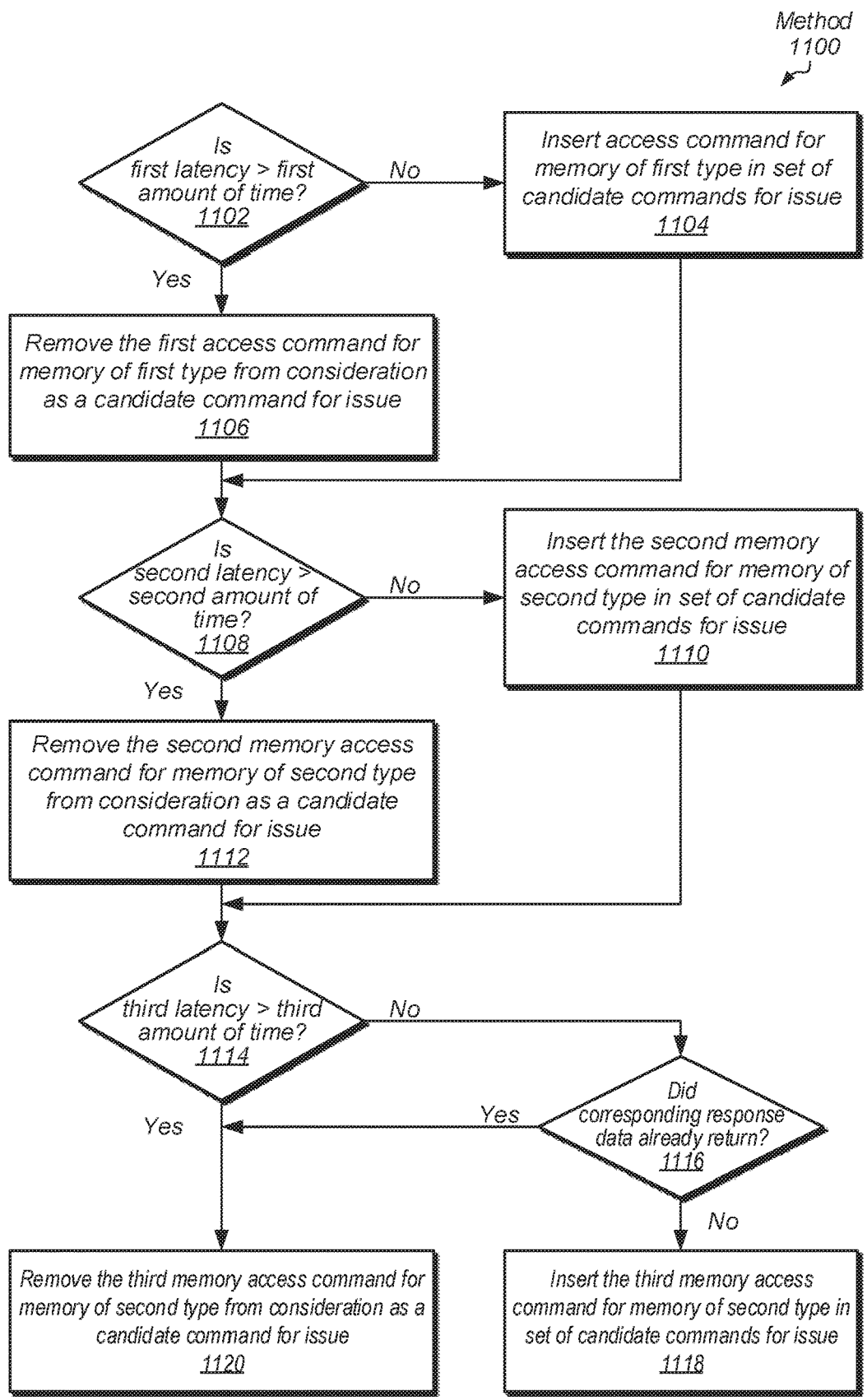
FIG. 11 is a flow diagram of another embodiment of a method for scheduling memory requests for issue to two different memory types.

Turning now to FIG. 11, one embodiment of a method 1100 for scheduling memory requests for issue to two different memory types is shown. In order to select an access command and schedule the access command for issue at a point in time that allows the selected access command to provide response data at a targeted given point in time, particular comparisons of timing values are done. In some embodiments, the following steps are performed after block 1014 of method 1000 (of FIG. 10).

If the first latency is not greater than the first amount of time ("no" branch of the conditional block 1102), then a first memory access command for the first memory type is inserted in a set of candidate commands for issue (block 1104). In other words, if the accumulated latencies of the memory access command for the first memory type and any additional commands used to prepare the memory access command for issue is less than or equal to an amount of time between the last issue of any command for the first memory type and the given point in time, then there is sufficient time to issue the memory access command for the first memory type. For example, referring again to timing diagram 500 (of FIG. 5), there needs to be at least four clock cycles between the issue of "READ C" at CC 8 and the completion of issuing "READ B" by CC 4.

If the first latency is greater than the first amount of time ("yes" branch of the conditional block 1102), then the first memory access command for the first memory type is removed from consideration as a candidate command for issue (block 1106). Similar steps are performed for a second memory access command for the second memory type. For example, if the second latency is not greater than the second amount of time ("no" branch of the conditional block 1108), then the second memory access command for the second memory type is inserted in the set of candidate commands for issue (block 1110). Otherwise, if the second latency is greater than the second amount of time ("yes" branch of the conditional block 1108), then the second memory access command for the second memory type is removed from the set of candidate commands for issue (block 1112).

Similar steps are performed for a third memory access command for the second memory type. However, in some embodiments, a check is made as to whether the requested read data was already returned for the corresponding original memory access command. Referring briefly again to the timing diagram 400 (of FIG. 4), the read command "SREAD B" is issued since the requested read data was not returned for the original transaction read command "READ B". At CC 7, the requested read data is scheduled to arrive, but it was not returned from the second memory type. However, no subsequent read command is issued for read command "READ D," since the requested read data was returned at the scheduled given point in time at CC 9. In some embodiments, the memory controller receives an indication on another channel or link interface specifying whether the response data for a read access command is now available for a particular one of the first memory type and the second memory type. In other embodiments, the memory controller issues speculative read commands to determine whether the response data is ready.

If the third latency is not greater than the third amount of time ("no" branch of the conditional block 1114), and it is determined the corresponding response data did not yet return ("no" branch of the conditional block 1116), then the third memory access command for the second memory type is inserted in the set of candidate commands for issue (block 1118). If the third latency is not greater than the third amount of time ("no" branch of the conditional block 1114), and it is determined the corresponding response data did return ("yes" branch of the conditional block 1116), then the third memory access command for the second memory type is removed from the set of candidate commands for issue (block 1120). Likewise, if the third latency is greater than the third amount of time ("yes" branch of the conditional block 1114), then the third memory access command for the second memory type is removed from the set of candidate commands for issue (block 1120).

Figure 12:
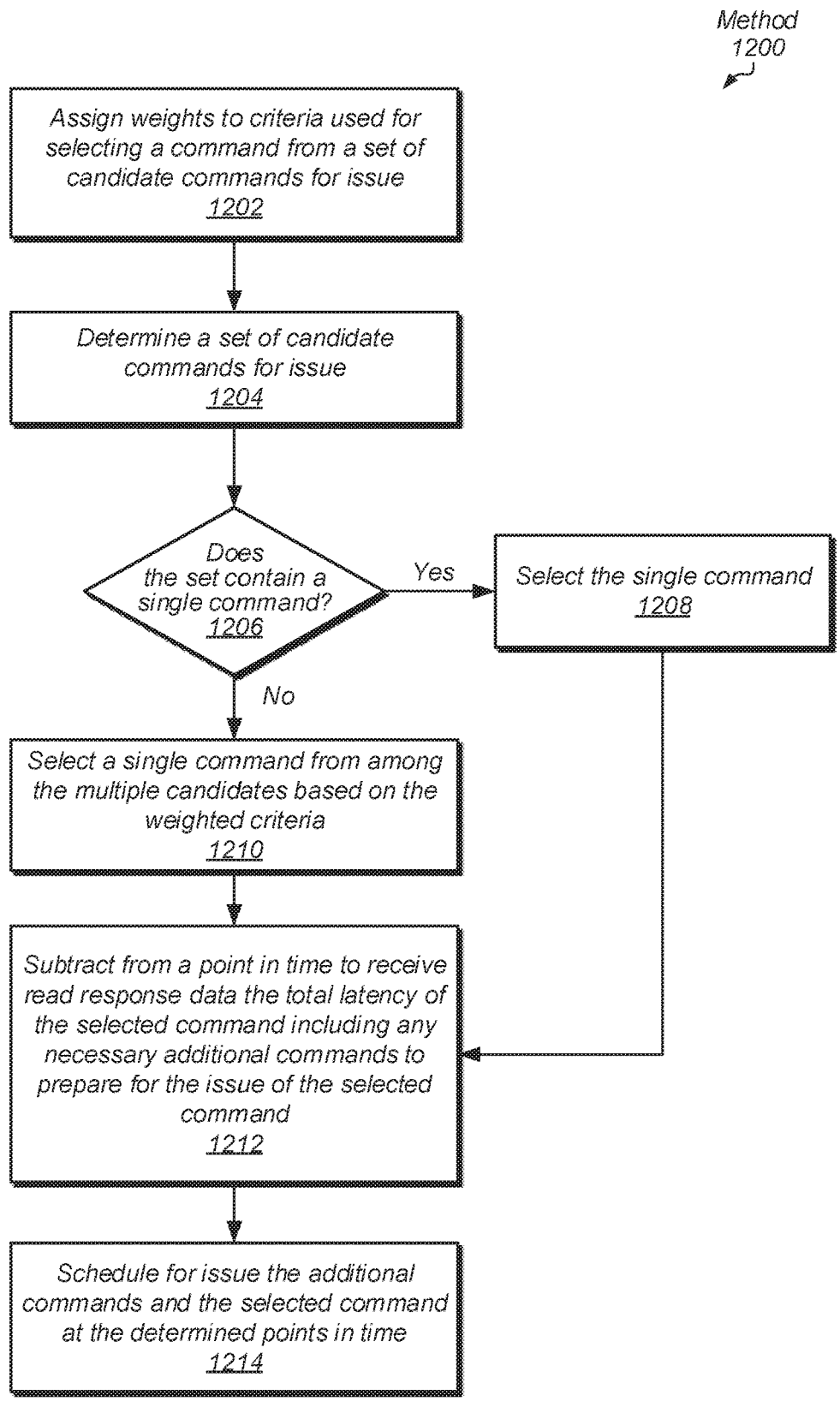
FIG. 12 is a flow diagram of another embodiment of a method for scheduling memory requests for issue to two different memory types.

Turning now to FIG. 12, one embodiment of a method 1200 for scheduling memory requests for issue to two different memory types is shown. In order to select an access command and schedule the access command for issue at a point in time that allows the selected access command to provide response data at a targeted given point in time, arbitration among a set of qualified candidate commands is done. In some embodiments, the following steps are performed after the steps of method 1100 (of FIG. 11). Weights are assigned to criteria used for selecting a command from a set of candidate commands for issue (block 1202).

As described earlier, the criteria includes one or more of a QoS or other priority information, age, a process or thread identifier (ID), an amount of time since a memory access command had been issued to the first memory type, and an amount of time since a memory access command or a status access command had been issued to the second memory type. In some embodiments, programmable control and status registers store the weights assigned to the selected criteria. A set of candidate commands is determined for issue (block 1204). In an embodiment, commands are qualified after the steps of the previous methods 900-1100. If the set contains a single command ("yes" branch of the conditional block 1206), then the single command is selected for issue (block 1208).

If the set contains multiple commands ("no" branch of the conditional block 1206), then a single command is selected from among the multiple candidates based on the weighted criteria (block 1210). As described earlier, in some embodiments, schedulers assign a given weight to each of the criteria and perform a weighted sum. The memory access command or status access command with the greatest sum is selected for issue. The total latency of the selected command including any necessary additional commands to prepare for the issue of the selected command is subtracted from a point in time the read response data is scheduled to arrive (block 1212). The additional commands and the selected access command are scheduled to issue at the determined points in time found by performing the subtraction (block 1214).

Figure 13:
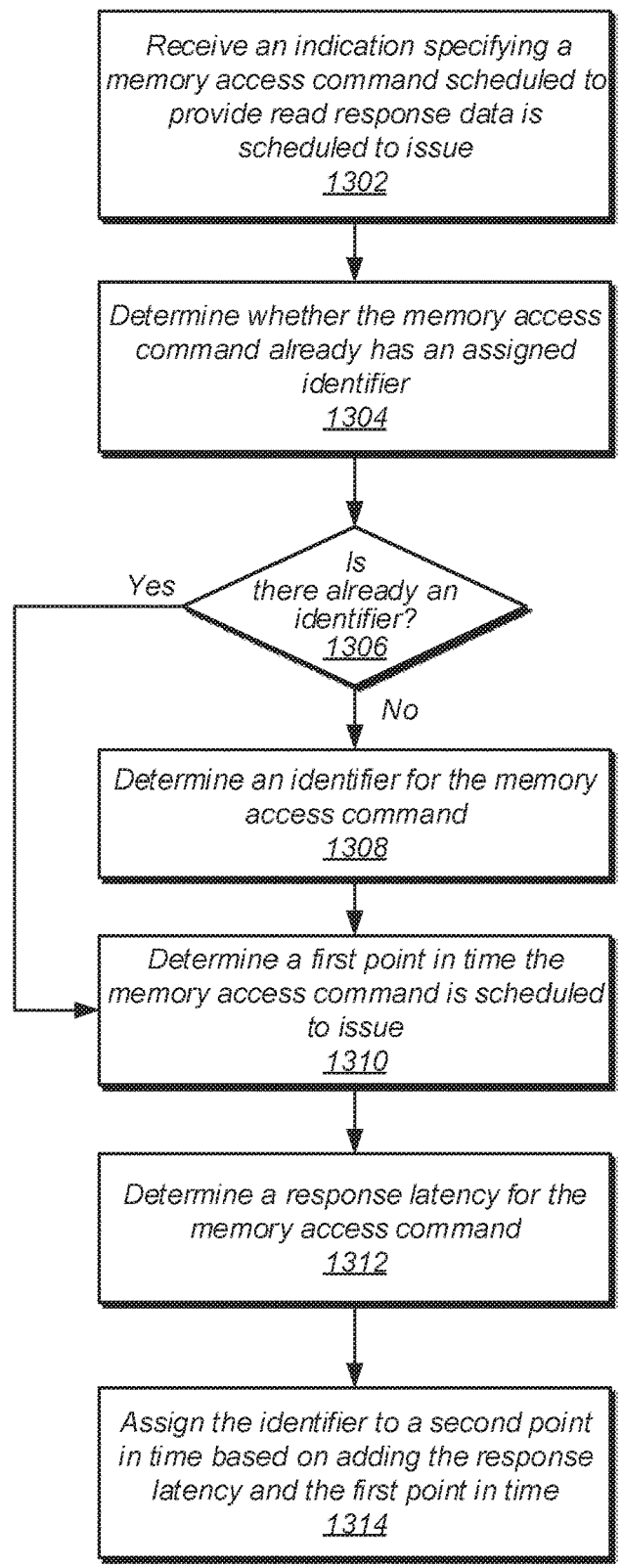
FIG. 13 is a flow diagram of one embodiment of a method for identifying response data arriving out-of-order from two different memory types

Turning now to FIG. 13, one embodiment of a method 1300 for identifying read response data arriving out-of-order from two memories with different access latencies is shown. In various embodiments, one or more of the memories is a memory type that responds with a deterministic response time. In such an embodiment, the response includes the requested data or the response indicates the data is not currently ready. In some embodiments, such a memory type is NVDIMM-P. As shown in the embodiment of FIG. 13, an indication is received that a memory access command (e.g., a read request) is ready for issue to one of the memories (block 1302). A determination is then made as to whether the memory access command already has an assigned identifier (block 1304). If there is not already an identifier ("no" branch of the conditional block 1306), then an identifier is generated or otherwise assigned for the memory access command (block 1308). In some embodiments, the identifier is an identification of an entry in a request queue that stores information corresponding to the memory access command. In other embodiments, the identifier is a combination of one or more of a thread identifier and a portion of a target address of the memory request corresponding to the memory access command.

If there is already an identifier for the command ("yes" branch of the conditional block 1306), then control flow of method 1300 moves to block 1310 where a determination is made as to a first point in time that the memory access command is scheduled to issue (block 1310). For example, a scheduler can provide this information when the scheduler selects the memory access command for issue.

Further, a response latency for the memory access command is determined (block 1312). In various embodiments, memory access commands for each of a first memory type and a second memory type of the memories, in addition to status access commands for the second memory type, have deterministic latencies. However, each command can have a latency different from a latency of another command. The identifier is then associated with a second point in time that corresponds to a time a response to the command is expected (block 1314). For example, if the time the command is to issue is T1 and the latency is determined to be equal to 100 cycles (or some other measure of latency), then the second point in time is equal to T1+100. In various embodiments, the identifier is not included with the memory access command when it is conveyed to the memory. Rather, the point in time that a response to the command is scheduled to arrive, such as a particular clock cycle, is used to identify the access command that corresponds to the received response.

Figure 14:
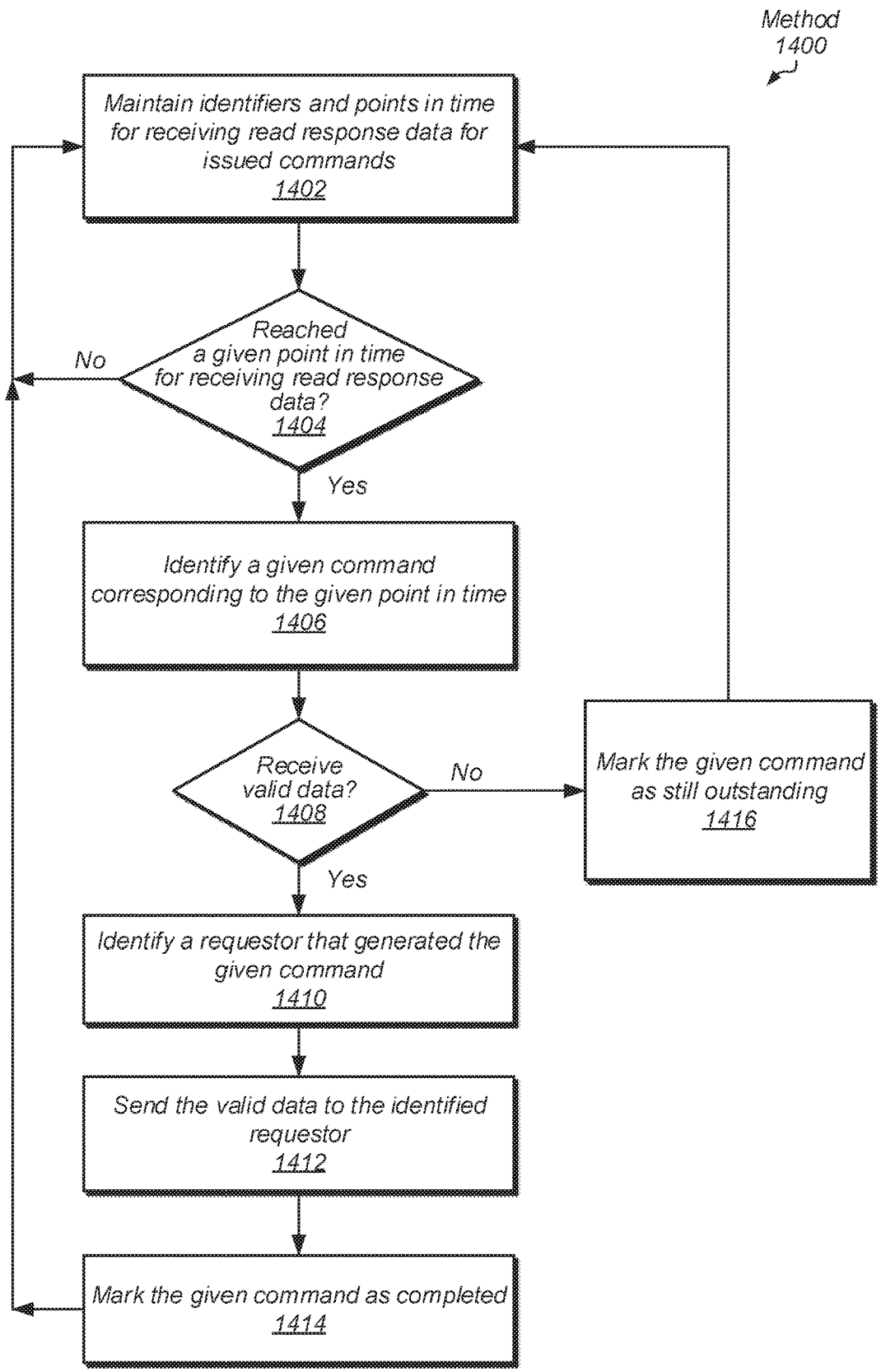
FIG. 14 is a flow diagram of another embodiment of a method for identifying response data arriving out-of-order from two different memory types.

Referring to FIG. 14, one embodiment of a method 1400 for identifying response data arriving out-of-order from two different memory types is shown. In order to match received read data to corresponding access commands, without inserting tags or other identifiers in the issued commands, control logic in a response scheduler performs the below steps. In some embodiments, the following steps are performed after the steps of method 1300 (of FIG. 13).

Identifiers and points in time are maintained for receiving read response data for issued commands (block 1402). If a given point in time for receiving read response data has arrived ("yes" branch of the conditional block 1404), then a given command corresponding to the reached point in time is identified (block 1406) based on the point in time. In some embodiments, numbered clock cycles are used to indicate points in time. In other embodiments, another count or measure of time is used. In various embodiments, the given point in time is used to index into a table to determine an identifier associated with the corresponding command. For example, in some embodiments the identifier is an indication of the entry in a request queue that stores information corresponding to the memory access command. In other embodiments, the identifier is a combination of one or more of a thread identifier and a portion of a target address of the memory request corresponding to the memory access command.

If valid data is received at the given point in time ("yes" branch of the conditional block 1408), then a requestor that generated the given command is identified (block 1410), the valid data is sent to the identified requestor (block 1412), and the given command is marked as completed (block 1414). If valid data is not received at the given point in time ("no" branch of the conditional block 1408), then the given command remains outstanding (block 1416).

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A memory controller comprising:
   a memory channel configured to communicate with a first memory device and a second memory device via a shared data bus; and
   a control unit configured to:
      identify one or more commands that are pending for issuance to at least one of the first memory device and the second memory device; and
      send a command of the one or more commands via the memory channel responsive to a determination that sending the command will not cause a collision on the shared data bus.

2. The memory controller as recited in claim 1, wherein to determine whether sending the command will cause a collision on the shared data bus, the control unit is configured to determine when a previous command was sent to at least one of the first memory device and the second memory device.

3. The memory controller as recited in claim 2, wherein an access latency of the first memory device is deterministic, and an access latency of the second memory device is not deterministic.

4. The memory controller as recited in claim 3, wherein an access latency corresponds to a latency of receiving valid read data in response to a read command.

5. The memory controller as recited in claim 4, wherein a latency of a response to a command issued to the second memory device is deterministic.

6. The memory controller as recited in claim 1, wherein the memory controller comprises scheduling logic configured to schedule the one or more commands to be sent to the first memory device and the second memory device.

7. The memory controller as recited in claim 6, wherein the scheduling logic is configured to maintain a schedule of available time slots for sending commands to the first memory device and the second memory device.

8. The memory controller as recited in claim 7, wherein the scheduling logic is configured to maintain the schedule of available time slots as a vector of bits.

9. The memory controller as recited in claim 1, wherein to determine whether sending the command will cause a collision on the shared data bus, the control unit is configured to determine when a response to a previous command will be received.

10. A method comprising:
    communicating, by a memory controller, with a first memory device and a second memory device via a shared data bus;
    identifying one or more commands that are pending for issuance to at least one of the first memory device and the second memory device; and sending, via the memory channel, a command of the one or more commands responsive to determining that sending the command will not cause a collision on the shared data bus.

11. The method as recited in claim 10, wherein determining whether sending the command will cause a collision on the shared data bus comprises determining when a previous command was sent to at least one of the first memory device and the second memory device.

12. The method as recited in claim 11, wherein an access latency of the first memory device is deterministic, and an access latency of the second memory device is not deterministic.

13. The method as recited in claim 12, wherein an access latency corresponds to a latency of receiving valid read data in response to a read command.

14. The method as recited in claim 13, wherein a latency of a response to a command issued to the second memory device is deterministic.

15. The method as recited in claim 10, further comprising scheduling the one or more commands to be sent to the first memory device and the second memory device.

16. The method as recited in claim 15, further comprising maintaining a schedule of available time slots for sending commands to the first memory device and the second memory device.

17. The method as recited in claim 16, further comprising maintaining the schedule of available time slots as a vector of bits.

18. The memory controller as recited in claim 10, wherein determining whether sending the command will cause a collision on the shared data bus comprises determining when a response to a previous command will be received.

19. A computing system comprising:
a client; and
a memory controller configured to:
receive a read request from the client; and
determine whether to send a command corresponding to the read request to a memory device, based at least in part on a determination as to whether the command will cause a collision on a shared data bus.

20. The computing system as recited in claim 19, wherein to determine whether sending the command will cause a collision on the shared data bus, the memory controller is configured to determine when a response to a previously sent command will be received.

* * * * *

UNITED STATES PATENT AND TRADEMARK OFFICE
CERTIFICATE OF CORRECTION

PATENT NO. : 11,474,942 B2  
APPLICATION NO. : 16/959496  
DATED : October 18, 2022  
INVENTOR(S) : Balakrishnan et al.

Page 1 of 1

It is certified that error appears in the above-identified patent and that said Letters Patent is hereby corrected as shown below:

On the Title Page

Item (72) Inventors:  
Lines 1-2, please delete "Bangalore (IN)" and substitute -- Whitefield, Bangalore (IN) --.

Signed and Sealed this  
Twenty-fourth Day of January, 2023

Katherine Kelly Vidal  
*Director of the United States Patent and Trademark Office*